(12) United States Patent
Jeon et al.

(10) Patent No.: US 9,431,969 B2
(45) Date of Patent: Aug. 30, 2016

(54) DOHERTY POWER AMPLIFIER WITH TUNABLE IMPEDANCE LOAD

(71) Applicant: RF Micro Devices, Inc., Greensboro, NC (US)

(72) Inventors: Hamhee Jeon, Torrance, CA (US); Kevin Wesley Kobayashi, Redondo Beach, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/103,089

(22) Filed: Dec. 11, 2013

(65) Prior Publication Data

US 2014/0159818 A1    Jun. 12, 2014

Related U.S. Application Data

(60) Provisional application No. 61/735,820, filed on Dec. 11, 2012, provisional application No. 61/747,017, filed on Dec. 28, 2012.

(51) Int. Cl.
*H03F 1/07* (2006.01)
*H03F 1/02* (2006.01)
*H03F 3/195* (2006.01)

(52) U.S. Cl.
CPC ............ *H03F 1/0288* (2013.01); *H03F 3/195* (2013.01)

(58) Field of Classification Search
CPC .......... H03F 1/07; H03F 1/0288; H03F 3/68; H03F 1/3252
USPC ............................. 330/295, 124 R, 84, 126
See application file for complete search history.

(56) References Cited

U.S. PATENT DOCUMENTS

| 4,187,471 A | 2/1980 | Shimoji et al. |
| 6,208,202 B1 | 3/2001 | Kaufman et al. |
| 6,262,629 B1 | 7/2001 | Stengel et al. |

(Continued)

FOREIGN PATENT DOCUMENTS

WO    2014007703 A1    1/2014

OTHER PUBLICATIONS

Doherty, W.H., "A New High Efficiency Power Amplifier for Modulated Waves," Proceedings of the Institute of Radio Engineers, vol. 24, No. 9, Sep. 1936, pp. 1163-1182.

(Continued)

*Primary Examiner* — Henry Choe
(74) *Attorney, Agent, or Firm* — Withrow & Terranova, P.L.L.C.

(57) ABSTRACT

Radio frequency (RF) amplification devices are disclosed that include Doherty amplification circuits and control circuits along with methods of operating the same. In one embodiment, the Doherty amplification circuit includes a quadrature coupler having an isolation port and a tunable impedance load coupled to the isolation port and configured to provide a tunable impedance. The control circuit is configured to tune the tunable impedance of the tunable impedance load at the isolation port dynamically as a function of the RF power of the Doherty amplification circuit. In this manner, the control circuit can provide dynamic load modulation, thereby increasing the power efficiency of the Doherty amplification circuit, particularly at backed-off power levels. The load modulation provided by the control circuit also allows the Doherty amplification circuit to provide broadband amplification in various RF communication bands.

21 Claims, 14 Drawing Sheets

(56) References Cited

U.S. PATENT DOCUMENTS

| | | | |
|---|---|---|---|
| 6,297,696 B1 | 10/2001 | Abdollahian et al. | |
| 6,864,742 B2 | 3/2005 | Kobayashi | |
| 7,064,606 B2 | 6/2006 | Louis | |
| 7,345,535 B2 | 3/2008 | Kwon et al. | |
| 7,570,932 B1* | 8/2009 | Folkmann | 455/127.1 |
| 8,314,654 B2 | 11/2012 | Outaleb et al. | |
| 8,346,189 B2 | 1/2013 | Dupuy et al. | |
| 8,417,201 B1 | 4/2013 | Schooley | |
| 8,508,296 B1 | 8/2013 | Mustafa et al. | |
| 8,564,367 B2* | 10/2013 | Svechtarov | 330/124 R |
| 8,593,219 B1 | 11/2013 | Root | |
| 8,970,297 B2* | 3/2015 | Lin et al. | 330/124 R |
| 2002/0186079 A1 | 12/2002 | Kobayashi | |
| 2005/0134377 A1* | 6/2005 | Dent | 330/124 R |

OTHER PUBLICATIONS

Jeon, Hamhee et al., "A Triple-Mode Balanced Linear CMOS Power Amplifier Using a Switched-Quadrature Coupler," IEEE Journal of Solid-State Circuits, vol. 47, No. 9, Sep. 2012, pp. 2019-2032.

Choi, Jinsung, et al., "Optimized Envelope Tracking Operation of Doherty Power Amplifier for High Efficiency Over an Extended Dynamic Range," IEEE Transactions on Microwave Theory and Techniques, vol. 57, No. 6, Jun. 2009, pp. 1508-1515.

Gustafsson, David, et al., "A Novel Wideband and Reconfigurable High Average Efficiency Power Amplifier," 2012 IEEE MTT-S International Microwave Symposium Digest, Jun. 17-22, 2012, pp. 1-3.

Lange, J., "Interdigitated Stripline Quadrature Hybrid," IEEE Transactions on Microwave Theory and Techniques, vol. 17, No. 12, Dec. 1969, pp. 1150-1151.

Mohamed, A.M.M., et al., "Reconfigurable Doherty Amplifier for Efficient Amplification of Signals with Variable PAPR," 2013 IEEE MTT-S International Microwave Symposium Digest (IMS), Jun. 2-7, 2013, pp. 1-3.

Non-Final Office Action for U.S. Appl. No. 14/314,357, mailed Sep. 21, 2015, 19 pages.

Non-Final Office Action for U.S. Appl. No. 14/501,453, mailed Dec. 4, 2015, 11 pages.

Notice of Allowance for U.S. Appl. No. 14/606,375, mailed Dec. 24, 2015, 7 pages.

Notice of Allowance for U.S. Appl. No. 14/314,357, mailed Apr. 18, 2016, 5 pages.

Notice of Allowance for U.S. Appl. No. 14/501,453, mailed Jun. 29, 2016, 7 pages.

* cited by examiner

DOHERTY POWER AMPLIFIER WITH TUNABLE IMPEDANCE LOAD

RELATED APPLICATIONS

This application claims the benefit of provisional patent application Ser. No. 61/735,820, filed on Dec. 11, 2012, and provisional patent application Ser. No. 61/747,017, filed on Dec. 28, 2012, the disclosures of which are hereby incorporated herein by reference in their entireties.

FIELD OF THE DISCLOSURE

This disclosure relates generally to radio frequency (RF) amplification devices.

BACKGROUND

In radio frequency (RF) applications, a conventional Doherty amplification circuit typically includes a main RF amplifier coupled in parallel with a peaking RF amplifier. At low power levels, the main RF amplifier in the conventional Doherty amplification circuit is activated and biased for linear operation, while the peaking RF amplifier is deactivated. The peaking RF amplifier is activated once an RF signal reaches a particular signal level, which is generally at or near a compression point of the main RF amplifier. To increase power efficiency, quarter wave transmission line transformers or quarter wave transmission line inverters are often employed in conventional Doherty amplification circuits in order to provide the appropriate impedance transformations while the peaking RF amplifier is activated and deactivated. Unfortunately, quarter wave transmission line transformers/inverters have narrowband characteristics and thus do not allow for broadband operation. Furthermore, at the higher frequencies, the quarter wave transmission line transformers/inverters in these conventional Doherty amplification circuits degrade the power efficiency of the Doherty amplification circuit at backed-off power levels. Generally, this is due to the narrowband characteristics of the quarter wave transmission line transformers/inverters and, in addition, to the inability of the quarter wave transmission line transformers/inverters to correct for parasitic effects in the peaking RF amplifier at higher frequencies.

Accordingly, RF circuit designs that improve bandwidth performance and/or the power efficiency of the Doherty amplification circuit are needed.

SUMMARY

Radio frequency (RF) amplification devices, along with methods of operating the same, are disclosed that include Doherty amplification circuits configured to amplify an RF signal. The Doherty amplification circuits are dynamically tunable in order to increase power efficiency and/or to allow for broadband operation. In one embodiment, an RF amplification device includes a control circuit and a Doherty amplification circuit configured to amplify an RF signal. The Doherty amplification circuit includes a quadrature coupler having an isolation port and a tunable impedance load coupled to the isolation port of the quadrature coupler and configured to provide a tunable impedance. The control circuit is configured to tune the tunable impedance of the tunable impedance load dynamically as a function of RF power in the Doherty amplification circuit. In this manner, the control circuit can provide dynamic load modulation to a load impedance presented to the main RF amplifier, thereby increasing the power efficiency of the Doherty amplification circuit, particularly at backed-off power levels. The dynamic load modulation provided by the control circuit thereby allows the Doherty amplification circuit to provide broadband amplification in various RF communication bands.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates an exemplary radio frequency (RF) amplification device having a Doherty amplification circuit and a control circuit, wherein the Doherty amplification circuit includes a first quadrature coupler that receives an RF signal; a main RF amplifier; a peaking RF amplifier; and a second quadrature coupler having an isolation port and a tunable impedance load coupled to the isolation port and configured to provide a tunable impedance.

Figure 2:
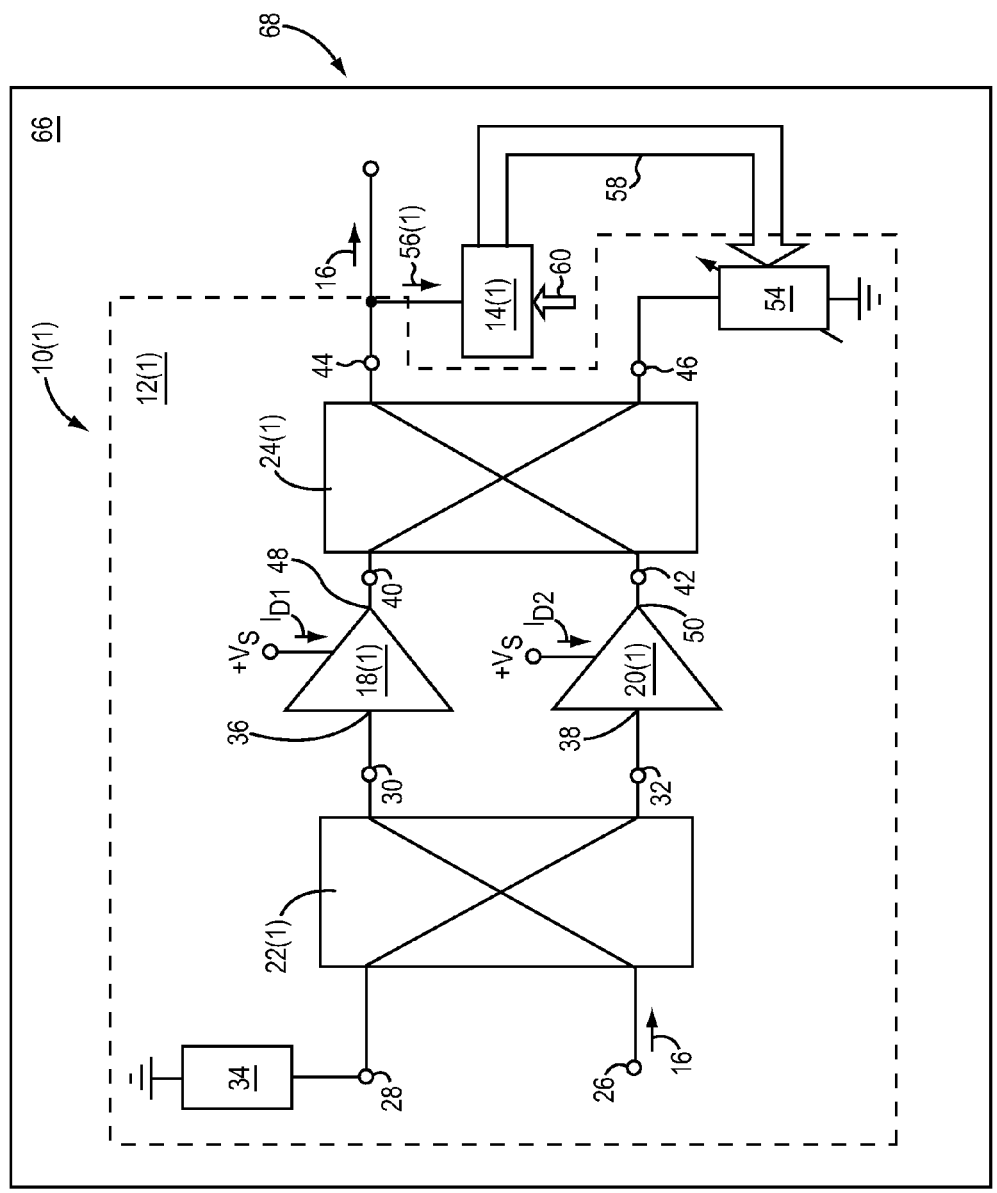
FIG. 2 illustrates one embodiment of the RF amplification device shown in FIG. 1, wherein the control circuit is configured to detect RF power in the Doherty amplification circuit at an output port provided by the second quadrature coupler.
Figure 5:
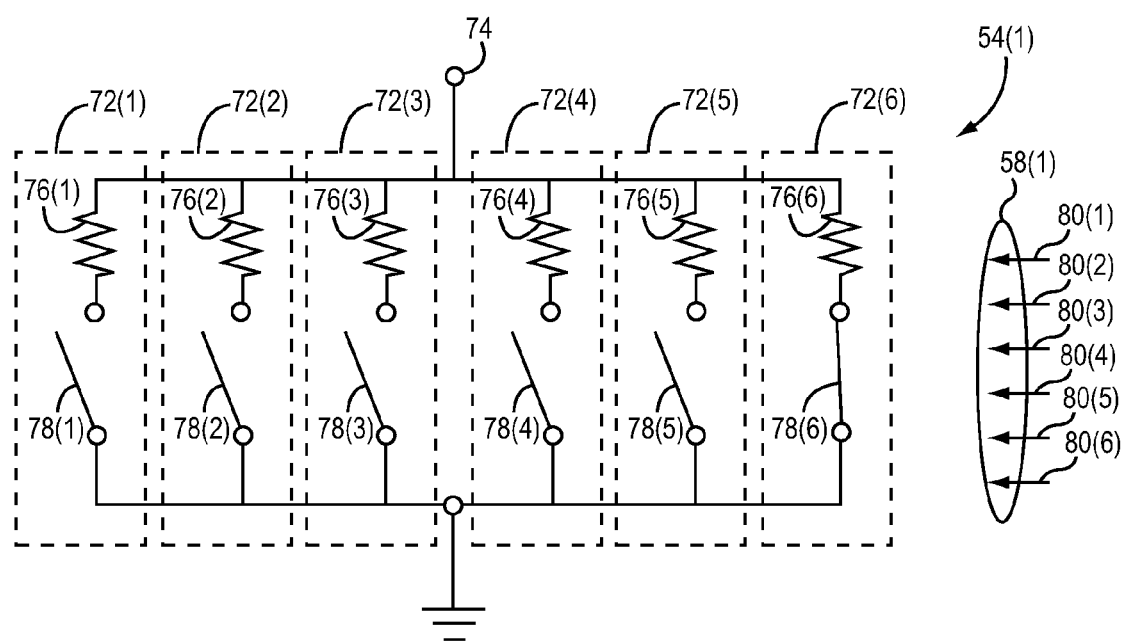
FIG. 5 illustrates one embodiment of the tunable impedance load shown in FIG. 1, where the embodiment of the tunable impedance load shown in FIG. 5 is purely resistive.
Figure 6:
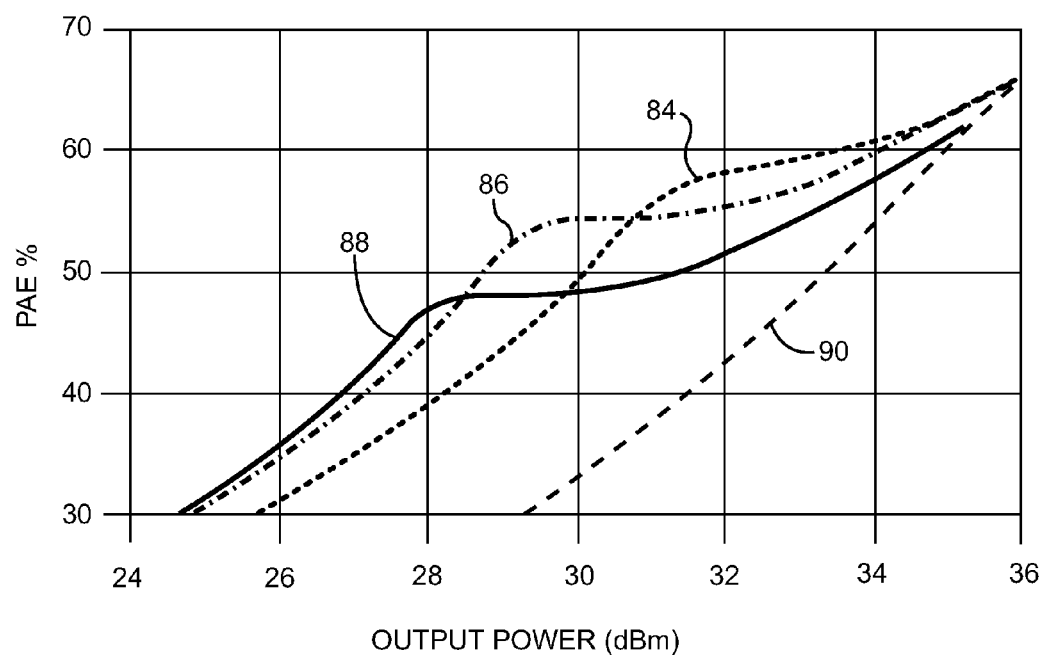

FIG. 6 illustrates is a graph including power curves that describe power added efficiency (PAE) as a function of output power in the RF amplification device shown in FIG. 2 using the tunable impedance load shown in FIG. 5, wherein each of the power curves demonstrates PAE versus output power for a different pairing of a carrier frequency of the RF signal and a tunable impedance of tunable impedance load where the carrier frequency/tunable impedance pairings correspond to (680 MHz, Znorm×10 (Znorm is a characteristic amplifier impedance of the Doherty amplification circuit), (850 MHz, Znorm×10), (1020 MHz, Znorm×10), and (850 MHz, Znorm).

Figure 1:
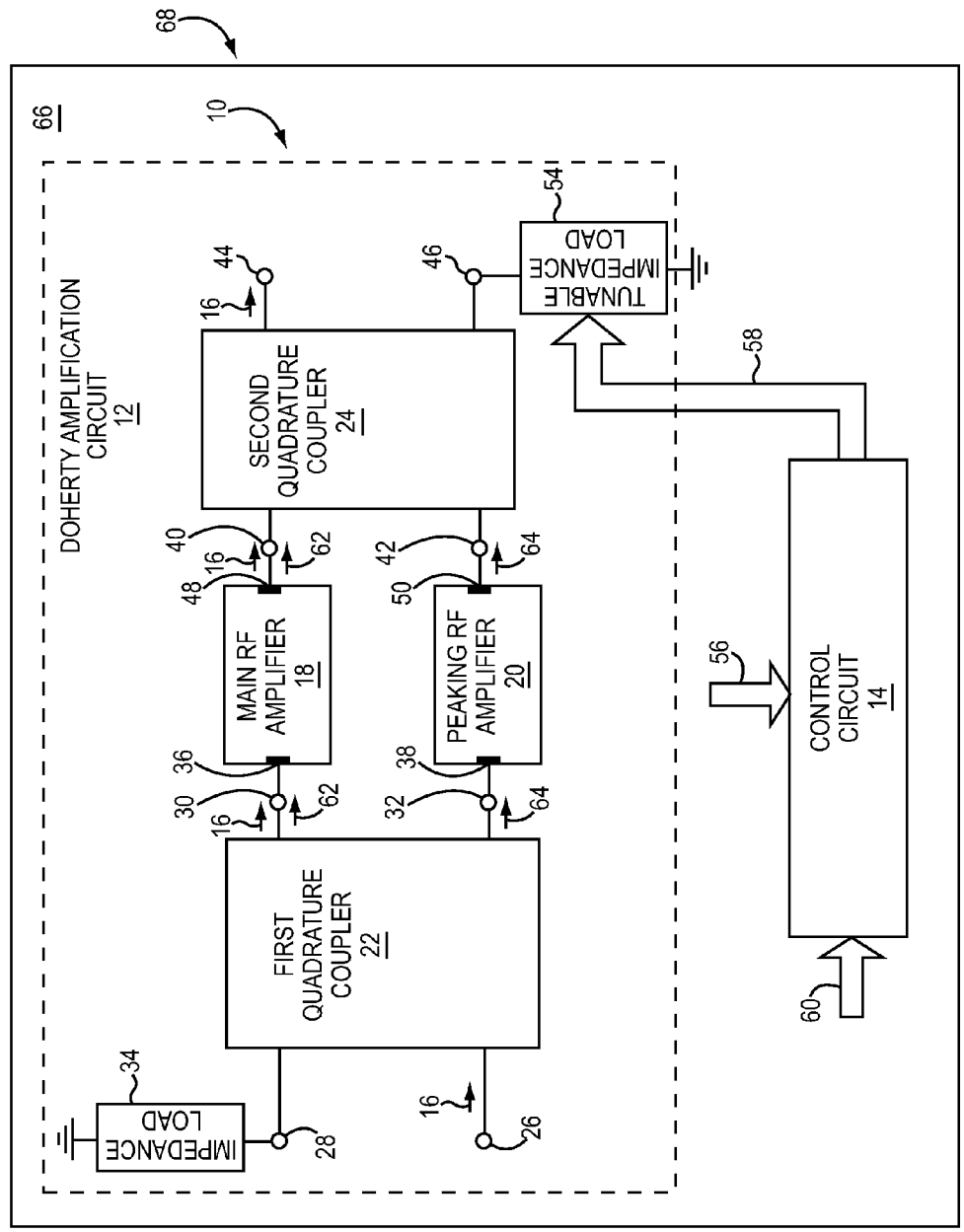
Figure 7:
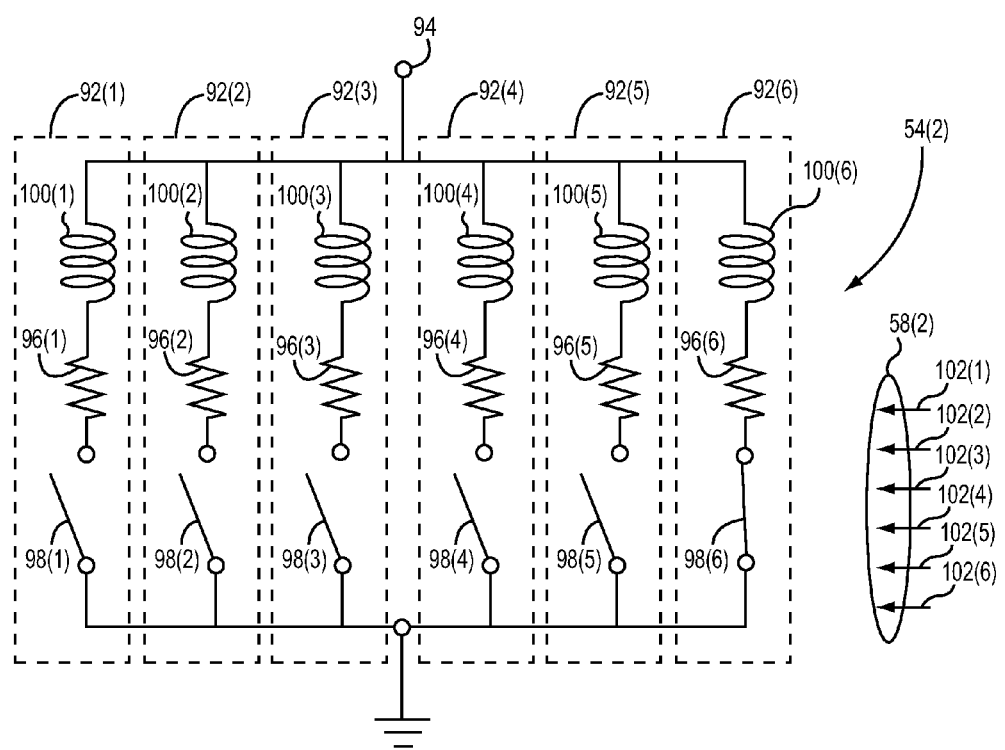

FIG. 7 illustrates another embodiment of the tunable impedance load shown in FIG. 1, where the embodiment of the tunable impedance load shown in FIG. 7 is resistive and inductive.

Figure 8:
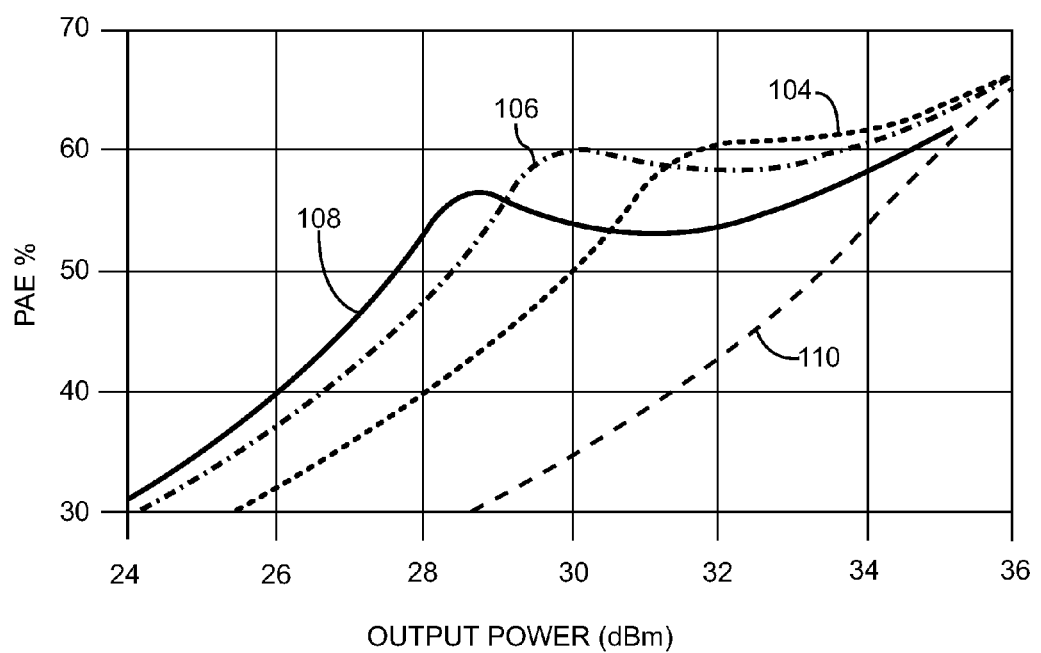

FIG. 8 is a graph including power curves that describe PAE as a function of output power in the RF amplification device shown in FIG. 2 using the tunable impedance load shown in FIG. 7, wherein each of the power curves demonstrates PAE versus output power where the carrier frequency/tunable impedance pairings correspond to (680

MHz, Znorm×10), (850 MHz, Znorm×10), (1020 MHz, Znorm×10), and (850 MHz, Znorm).

Figure 9:
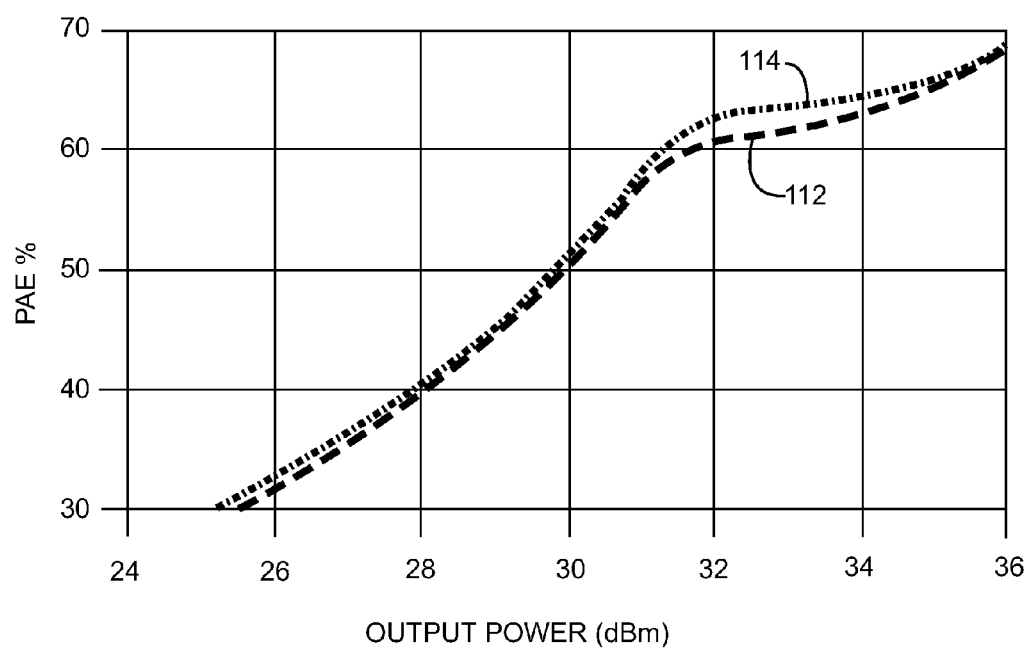

FIG. 9 illustrates power curves that describe PAE as a function of output power in the RF amplification device shown in FIG. 2, wherein one of the power curves is produced using the tunable impedance load shown in FIG. 5 and the other power curve is produced using the tunable impedance load shown in FIG. 7, and both power curves have a carrier frequency/tunable impedance pairing corresponding to (680 MHz, Znorm×10).

Figure 10:
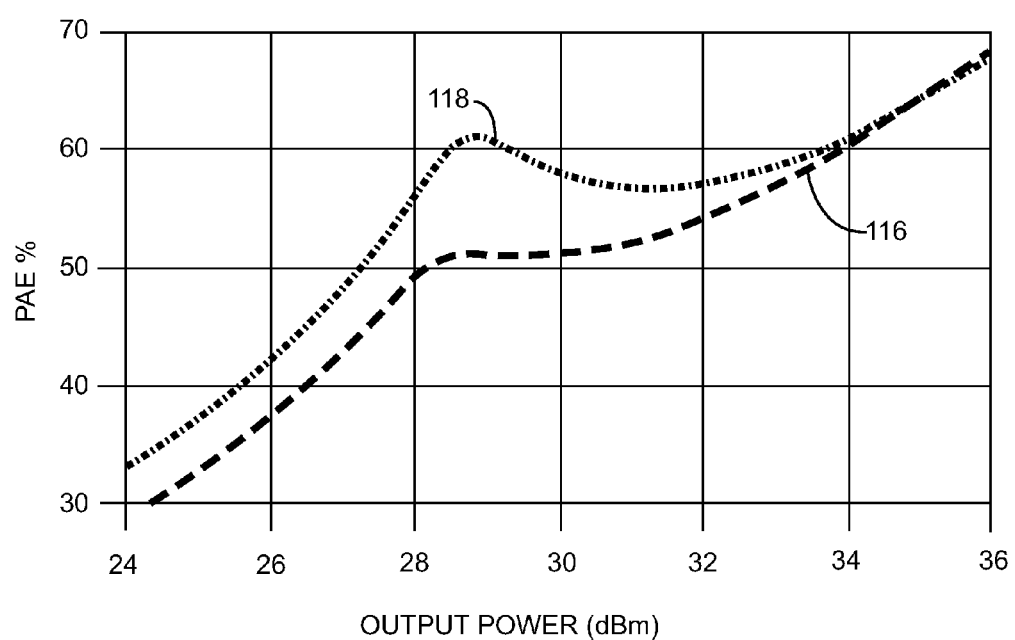

FIG. 10 illustrates power curves that describe PAE as a function of output power in the RF amplification device shown in FIG. 2, wherein one of the power curves is produced using the tunable impedance load shown in FIG. 5 and the other power curve is produced using the tunable impedance load shown in FIG. 7, and both power curves have a carrier frequency/tunable impedance pairing corresponding to (1020 MHz, Znorm×10).

Figure 11:
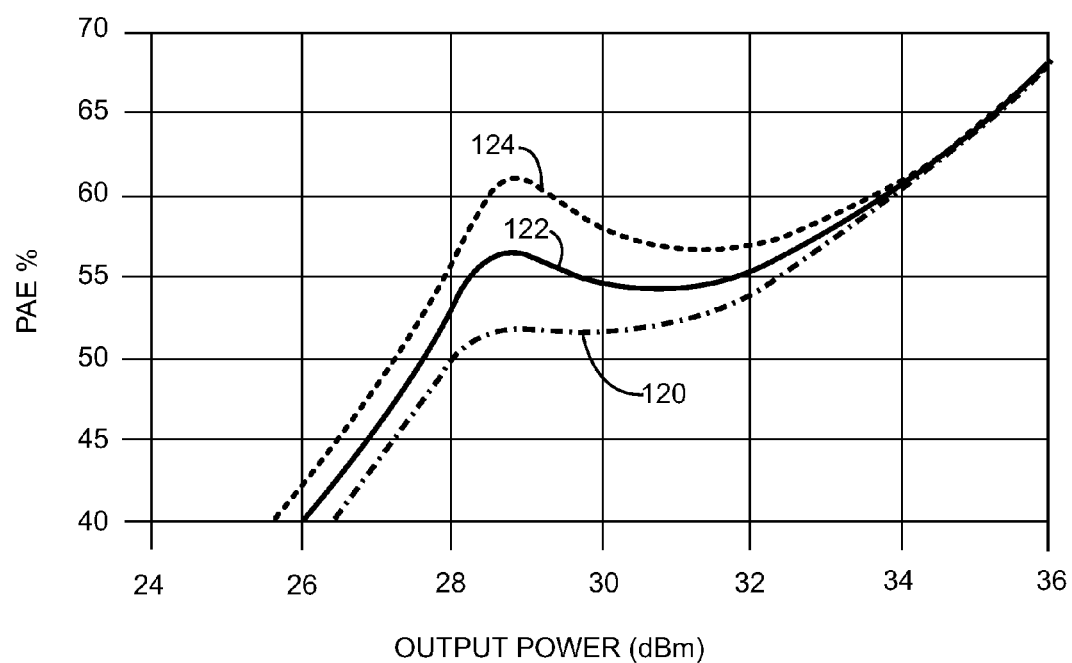

FIG. 11 illustrates power curves that describe PAE as a function of output power in the RF amplification device shown in FIG. 2, wherein two of the power curves are produced using the tunable impedance load shown in FIG. 5 and have carrier frequency/tunable impedance pairings of (1020 MHz, Znorm×10) and (1020 MHz, Znorm×40), respectively, and the other power curve is produced using the tunable impedance load shown in FIG. 7 and has a carrier frequency/tunable impedance pairing corresponding to (1020 MHz, Znorm×10).

Figure 12:
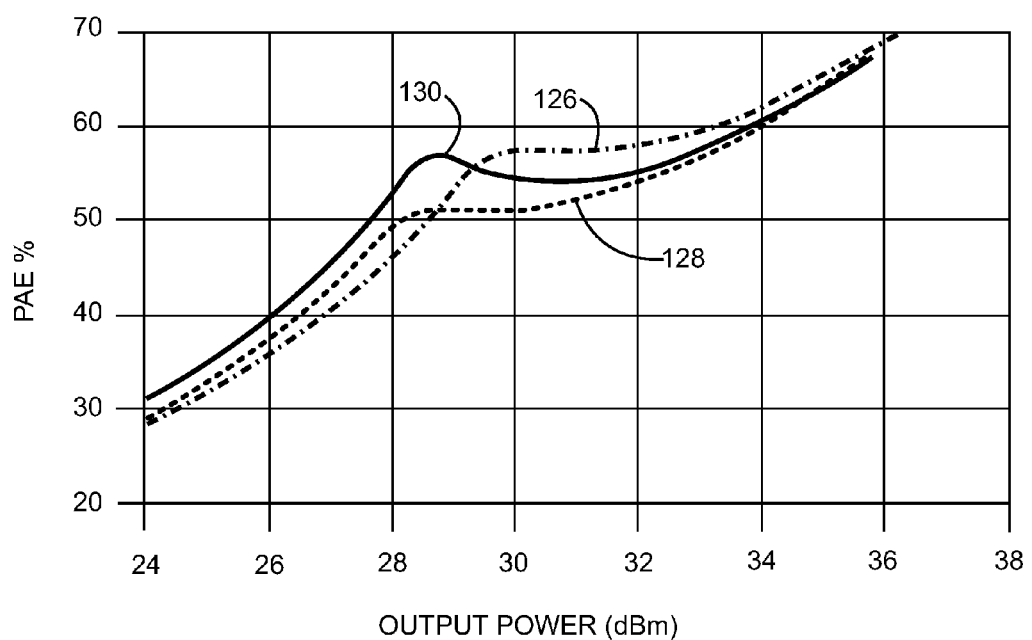

FIG. 12 illustrates power curves that describe PAE as a function of output power in the RF amplification device shown in FIG. 2, wherein all of the power curves are produced using the tunable impedance load shown in FIG. 5 and have carrier frequency/tunable impedance pairings of (850 MHz, Znorm×10), (1020 MHz, Znorm×10), and (1020 MHz, Znorm×30), respectively.

Figure 13:
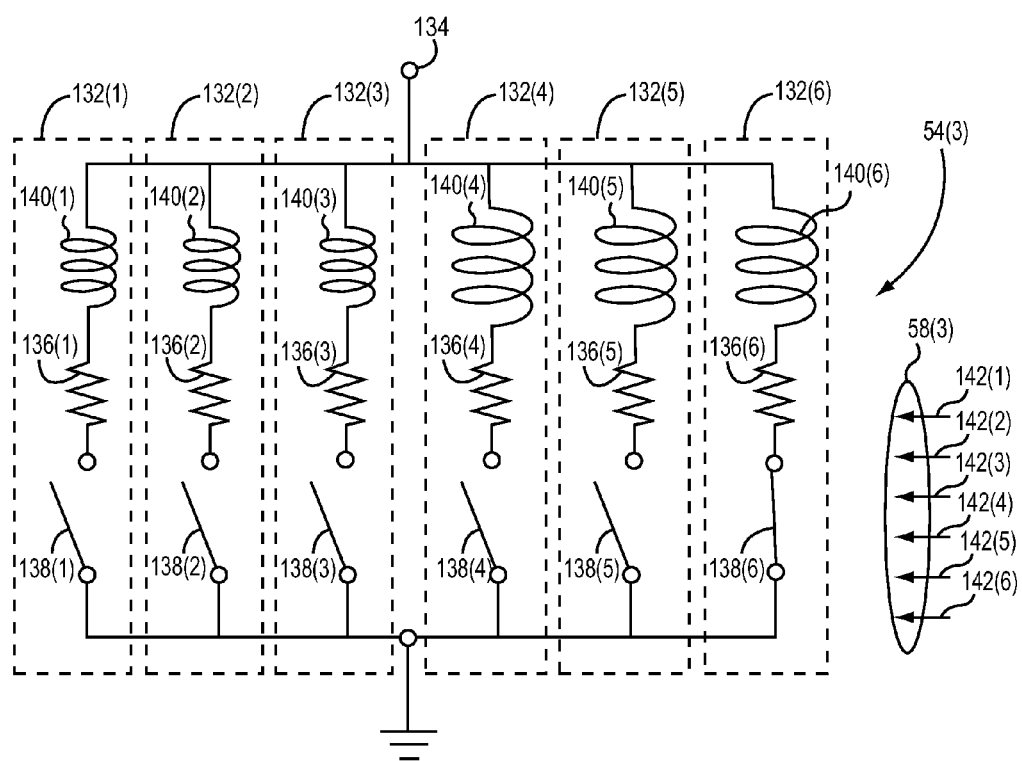

FIG. 13 illustrates yet another embodiment of the tunable impedance load shown in FIG. 1, where the embodiment of the tunable impedance load shown in FIG. 13 is resistive and inductive, like the embodiment in FIG. 7, but includes inductors with varying physical sizes.

Figure 14:
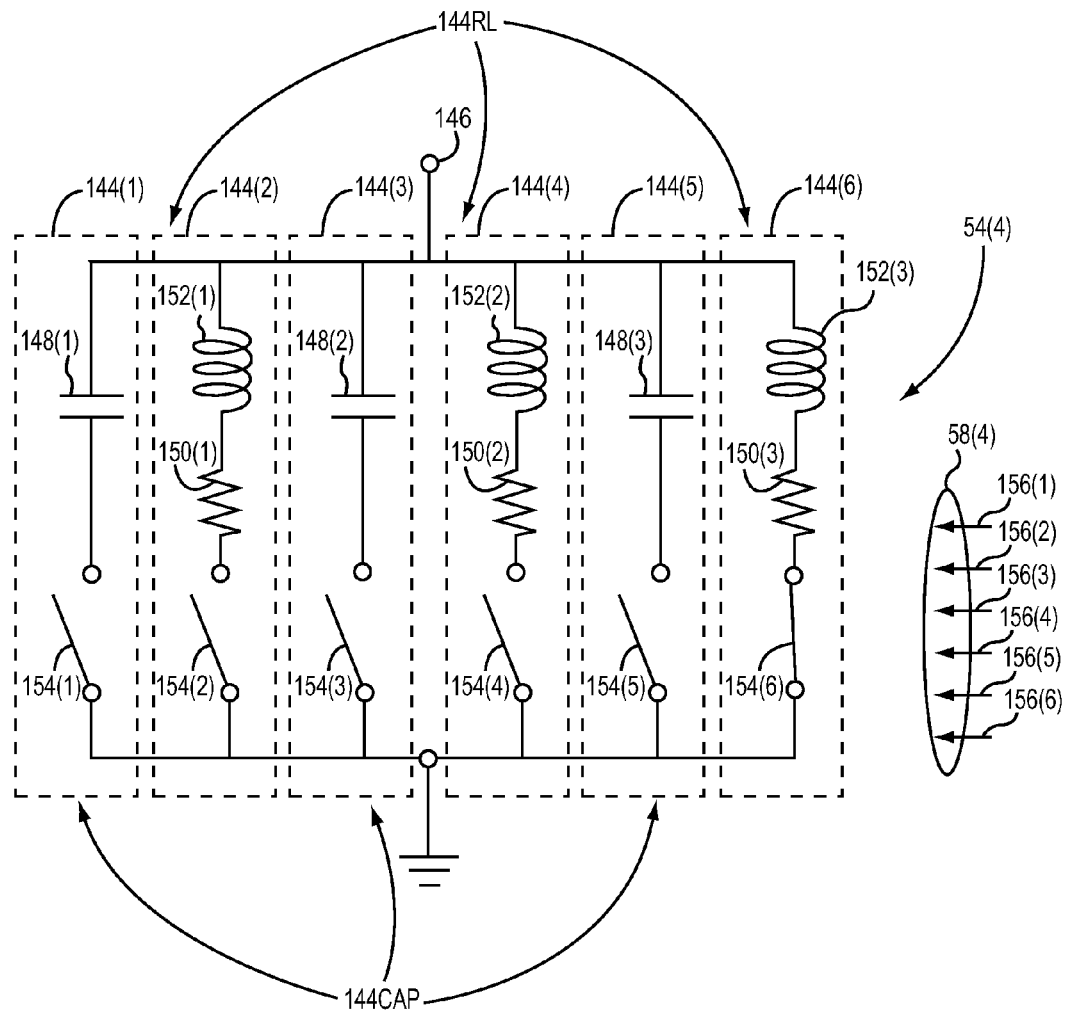

FIG. 14 illustrates still another embodiment of the tunable impedance load shown in FIG. 1, where the embodiment of the tunable impedance load shown in FIG. 14 is resistive, inductive, and capacitive so as to form resonant tanks.

DETAILED DESCRIPTION

FIG. 1 illustrates one embodiment of a radio frequency (RF) amplification device 10 having a Doherty amplification circuit 12 and a control circuit 14. As explained in further detail below, the control circuit 14 is operably associated with the Doherty amplification circuit 12 in order to improve the power performance and the Doherty characteristics of the Doherty amplification circuit 12. For instance, the control circuit 14 may be used in for the Doherty amplification circuit 12 to obtain improved power efficiency at backed-off power levels. Additionally, the control circuit 14 can also be used to improve the bandwidth performance of the Doherty amplification circuit 12 and thus allow the Doherty amplification circuit 12 to provide broadband amplification.

The Doherty amplification circuit 12 is configured to amplify an RF signal 16. To amplify the RF signal 16, the Doherty amplification circuit 12 includes a main RF amplifier 18 and a peaking RF amplifier 20. While a signal level of the RF signal 16 is below a threshold level, the peaking RF amplifier 20 is deactivated and the main RF amplifier 18 provides all of the amplification to the RF signal 16. The RF signal 16 may be any type of RF signal depending on the type of communication device (e.g., smartphone, tablet, laptop, base station, etc.) in which the Doherty amplification circuit 12 is provided and the amplification operation being provided by the Doherty amplification circuit 12. The main RF amplifier 18 is configured to amplify the RF signal 16 in accordance with a main amplifier gain of the main RF amplifier 18. So long as the main RF amplifier 18 is within a linear operating range (i.e., not saturated and below a compression point), the peaking RF amplifier 20 is deactivated.

The specific characteristics of the Doherty amplification circuit 12 may vary in accordance with the communication device and technological environment in which the Doherty amplification circuit 12 is employed and, in addition, the performance parameters relevant to the operation of the Doherty amplification circuit 12 for the particular application(s) of the Doherty amplification circuit 12 within the communication device (or prospective communication device(s)) and the technological environment (or prospective technological environment(s)). It should be noted that the RF amplification device 10 may be configured for operation in any suitable communication device and technological environment. Thus, the RF signal 16 may be any type of RF signal. More specifically, the RF amplification device 10 shown in FIG. 1 can be manufactured to meet the requirements of a wide variety of multiplexing schemes and RF communication standards. For example, the RF signal 16 may be an uplink signal transmitted to base stations and/or a downlink signal transmitted from base stations. Furthermore, the RF signal 16 may be encoded in accordance with any type of multiplexing scheme and/or RF communication standard. For example, the RF signal 16 may be multiplexed using time division multiplexing (TDM), frequency division multiplexing (FDM), space division multiplexing (SDM), code division multiple access (CDMA) multiplexing, orthogonal frequency division multiple access (OFDMA) multiplexing, and/or the like. Additionally, the RF amplification device 10 may be configured to provide duplexing for various RF communication standards. For example, the RF amplification device 10 may be configured to provide amplification for the RF signal 16 if the RF signal 16 is formatted in accordance with 2G Global System for Mobile Communications (GSM) standards, 3G standards, 4G Long Term Evolution (LTE) standards, and/or the like. Furthermore, the RF amplification device 10 may provide duplexing for one or more specifications within these RF communication standards, along with their RF communication bands. For instance, the RF signal 16 may be formatted in accordance with RF communication bands defined by specifications of the 2G GSM standard, such as a Digital Communication System (DCS) specification, a Personal Communications Service (PCS) specification, a GSM-850 specification, and a GSM-900 specification; specifications within the 3G standard, such as an Enhanced Data Rates for GSM Evolution (EDGE)-850 specification, an EDGE-950 specification, an EDGE-1800 specification, and an EDGE-1900 specification; and specifications within the 4G LTE standard, such as a Mobile Device Management (MDM) specification, a High Speed Packet Access (HSPA) specification, a Multiple-Input and Multiple-Output (MIMO) specification, and/or the like.

Note that relational terminology such as "substantially," "approximately," and/or the like should be interpreted objectively in accordance with the communication device and technological environment in which the RF amplification device 10 is employed and, in addition, the performance parameters relevant to the operation of the RF amplification device 10 for the particular application of the RF amplification device 10 within the communication device (or at least one prospective communication device) and the technological environment (or at least one prospective technological environment).

In this embodiment, the RF signal 16 may be an RF uplink signal for uplink to a base station from a mobile communication device (e.g., smartphone, tablet, laptop, etc.). The RF amplification device 10 may be within the mobile communication device and the mobile communication device may be using the Doherty amplification circuit 12 to amplify the RF signal 16 for transmission by an antenna (not shown). Alternatively, the RF amplification device 10 may be within the base station. Thus, the base station may be using the Doherty amplification circuit 12 for amplification upon reception of the RF signal 16 from the mobile communication device. In another embodiment, the RF signal 16 may be an RF downlink signal for downlink to the mobile communication device (e.g., smartphone, tablet, laptop, etc.) from the base station. In this case, the mobile communication device may be using the Doherty amplification circuit 12 to amplify the RF signal 16 after reception from the base station. Alternatively, the base station may be using the Doherty amplification circuit 12 to amplify the RF signal 16 for transmission by an antenna (not shown) to the mobile communication device.

Referring again to the Doherty amplification circuit 12 shown in FIG. 1, the output impedance of the peaking RF amplifier 20 is very high and the peaking RF amplifier 20 appears like an open circuit with respect to the main RF amplifier 18 while the main RF amplifier 18 is activated and the peaking RF amplifier 20 is deactivated. However, the peaking RF amplifier 20 is configured to activate in response to the signal level of the RF signal 16 reaching a threshold level. The Doherty amplification circuit 12 is configured such that the main RF amplifier 18 remains activated while the peaking RF amplifier 20 is activated. In some embodiments, the main RF amplifier 18 may be held at or near its peak power level (i.e., saturation). In general, this peak power level occurs just prior to the 1 dB compression point (i.e., a knee voltage) of the main RF amplifier 18 and thus when the main RF amplifier 18 is nearly saturated.

However, it should be noted that some embodiments of the RF amplification device 10 may hold the main RF amplifier 18 at backed-off power levels while the peaking RF amplifier 20 is activated. If the RF amplification device 10 holds the main RF amplifier 18 at backed-off power levels while the peaking RF amplifier 20 is activated, the control circuit 14 may be configured to reduce or prevent power-efficiency degradations in the Doherty amplification circuit 12 due to the main RF amplifier 18 operating at power levels backed off from the 1 dB compression point. This is typically desirable for modern communication systems.

As shown in FIG. 1, the main RF amplifier 18 and the peaking RF amplifier 20 are operably associated by a first quadrature coupler 22 and a second quadrature coupler 24. With regard to the first quadrature coupler 22, the first quadrature coupler 22 includes a first port 26, a second port 28, a third port 30, and a fourth port 32. It should be noted that throughout this disclosure, the term "port" refers to any type of definable circuit location and/or structure that is operable to receive and/or transmit electromagnetic signals to or from an electronic component. For example, a port may be a terminal, a contact, a pad, a pin, a wire, a conductive bond, a node, a group of more than one of the aforementioned elements (e.g., terminals for a differential signal), and/or the like.

The first port 26 of the first quadrature coupler 22 is operable to receive the RF signal 16. For example, the first port 26 may be coupled to receive the RF signal 16 from upstream RF circuitry (not shown) that is exogenous to the RF amplification device 10. Thus, a source impedance of the upstream RF circuitry may be presented to the Doherty amplification circuit 12 at the first port 26 of the first quadrature coupler 22.

The second port 28 of the first quadrature coupler 22 is an isolation port. In this embodiment, an impedance load 34 is coupled to the first quadrature coupler 22 at the second port 28. The impedance load 34 thus serves as a termination impedance of the first quadrature coupler 22.

As such, the second port 28 is isolated from the first port 26, the third port 30, and the fourth port 32. The third port 30 is coupled to an input terminal 36 of the main RF amplifier 18 while the fourth port 32 is coupled to an input terminal 38 of the peaking RF amplifier 20. In this embodiment, a resistance and a reactance of the impedance load 34 is configured to be constant. As such, the impedance load 34 shown in FIG. 1 is not tunable. For example, the terminating impedance of the impedance load 34 may be approximately equal to 50Ω. Also, in some embodiments, the impedance may be purely resistive and constant such that the impedance load 34 has no reactance.

The second quadrature coupler 24 shown in FIG. 1 is also operably associated with the main RF amplifier 18 and the peaking RF amplifier 20. The second quadrature coupler 24 includes a fifth port 40, a sixth port 42, a seventh port 44, and an eighth port 46. The fifth port 40 of the second quadrature coupler 24 is coupled to an output terminal 48 of the main RF amplifier 18. Thus, the main RF amplifier 18 is coupled between the third port 30 of the first quadrature coupler 22 and the fifth port 40 of the second quadrature coupler 24. The sixth port 42 is coupled to an output terminal 50 of the peaking RF amplifier 20. Thus, the peaking RF amplifier 20 is coupled between the fourth port 32 of the first quadrature coupler 22 and the sixth port 42 of the second quadrature coupler 24. An output impedance of the peaking RF amplifier 20 is thus presented at the sixth port 42 to the second quadrature coupler 24 and an input impedance of the peaking RF amplifier 20 is presented to the first quadrature coupler 22 at the fourth port 32.

The second quadrature coupler 24 is operable to transmit the RF signal 16 at the seventh port 44 after the RF signal 16 has been amplified by the Doherty amplification circuit 12. The seventh port 44 of the second quadrature coupler 24 is thus an output port of the Doherty amplification circuit 12. For example, the seventh port 44 may be coupled to transmit the RF signal 16 to downstream RF circuitry (not shown) that is exogenous to the RF amplification device 10. A load impedance of the downstream RF circuitry may thus be presented to the Doherty amplification circuit 12 at the seventh port 44 of the second quadrature coupler 24.

The eighth port 46 of the second quadrature coupler 24 is an isolation port. In this embodiment, a tunable impedance load 54 is coupled to the second quadrature coupler 24 at the eighth port 46. The tunable impedance load 54 is configured to provide a tunable impedance, which is provided as a termination impedance of the second quadrature coupler 24. Thus, the tunable impedance load 54 may have a variable resistance and/or a variable reactance. Since the tunable impedance may be set by the variable resistance and/or the variable reactance, adjusting the variable resistance and/or the variable reactance of the tunable impedance load 54 thereby adjusts the termination impedance of the second quadrature coupler 24.

The control circuit 14 is configured to detect RF power in the Doherty amplification circuit 12. For example, in this embodiment, the control circuit 14 is configured to receive a feedback input 56 that indicates RF power in the Doherty amplification circuit 12. The feedback input 56 may include one or more feedback signals that indicate the RF power in the Doherty amplification circuit 12. The control circuit 14 may be analog, digital, or both, and thus may detect the RF power using analog techniques, digital techniques, and/or a mixture of both. When digital techniques are employed, digital-to-analog converters may be employed by the control circuit 14 such that the feedback input 56 can be converted into a digital reading related to RF power of the Doherty amplification circuit 12. If analog techniques are employed, the feedback input 56 may result in an analog response controlled by the characteristics of the feedback input 56 that indicate the RF power in the Doherty amplification circuit 12. Variations in topology and design for the control circuit 14 would be apparent to one of ordinary skill in the art provided one of ordinary skill in the art has a proper understanding of the control principles described in this disclosure. The control circuit 14 may thus also detect RF power in the Doherty amplification circuit 12 dynamically, as long as the Doherty amplification circuit 12 is providing amplification to the RF signal 16. In this manner, the control circuit 14 can respond dynamically to both exogenous and endogenous changes that result in modifications in the RF power of the Doherty amplification circuit 12.

The Doherty amplification circuit 12 has a characteristic amplifier impedance Znorm. The characteristic amplifier impedance Znorm is a source impedance of the Doherty amplification circuit 12. As seen from an input side of the second quadrature coupler 24, the characteristic amplifier impedance Znorm is a source impedance presented at the fifth port 40 of the second quadrature coupler 24 from the main RF amplifier 18. The second quadrature coupler 24 provides an impedance transformation to the characteristic amplifier impedance Znorm and the characteristic amplifier impedance Znorm presented from an output side of the second quadrature coupler 24 at the seventh port 44 with the impedance transformation. Thus, the characteristic amplifier impedance Znorm is also presented as a source impedance at the seventh port 44, but with the impedance transformation provided by the second quadrature coupler 24 relative to the input side at the fifth port 40.

A load impedance is presented at the output side of the second quadrature coupler 24 at the seventh port 44. For example, the downstream RF circuitry may be coupled to the seventh port 44 to present the load impedance at the seventh port 44. At the seventh port 44, the load impedance is seen from the output side of the second quadrature coupler 24. From the input side of the second quadrature coupler 24, the second quadrature coupler 24 provides an impedance transformation to the load impedance presented at the seventh port 44. From the input side, the load impedance is presented by the second quadrature coupler 24 to the main RF amplifier 18, but transformed relative to the output side of the second quadrature coupler 24 in accordance with the impedance transformation provided by the second quadrature coupler 24. In this embodiment, the second quadrature coupler 24 presents the load impedance to the main RF amplifier 18 at the fifth port 40.

To improve power efficiency, the control circuit 14 is configured to tune the tunable impedance load 54 dynamically as a function of the RF power detected in the Doherty amplification circuit 12. This adjusts the impedance transformations provided by the second quadrature coupler 24 to the source impedances and the load impedances described above. Thus, by tuning the tunable impedance load 54, the control circuit 14 can set the load impedance presented to the main RF amplifier 18 by the second quadrature coupler 24 at the fifth port 40 and the characteristic amplifier impedance Znorm presented at the seventh port 44 at or close to optimal values in different RF communication bands.

To provide Doherty amplification operation, the load impedance should approximately equal double the characteristic amplifier impedance Znorm while the peaking RF amplifier 20 is deactivated at the fifth port 40. Thus, when the main RF amplifier 18 is approximately saturated and the peaking RF amplifier 20 is deactivated, the load impedance should equal approximately double the characteristic amplifier impedance Znorm at the fifth port 40. However, while the peaking RF amplifier 20 is activated, the load impedance seen by the main RF amplifier 18 is decreased from approximately double the characteristic amplifier impedance Znorm to approximately the characteristic amplifier impedance Znorm. When both the main RF amplifier 18 and the peaking RF amplifier 20 are approximately at saturation, the load impedance seen by the main RF amplifier 18 should be equal to the characteristic amplifier impedance Znorm.

The control circuit 14 may be configured to tune the tunable impedance of the tunable impedance load 54 dynamically so as to provide a Doherty amplification operation in different RF communication bands. As mentioned above, while the main RF amplifier 18 is activated and the peaking RF amplifier 20 is being deactivated, the control circuit 14 is configured to tune the tunable impedance of the tunable impedance load 54 dynamically as the function of the RF power of the Doherty amplification circuit 12 such that the load impedance presented by the second quadrature coupler 24 to the main RF amplifier 18 at the fifth port 40 is approximately equal to double the characteristic amplifier impedance Znorm of the Doherty amplification circuit 12. For example, if the load impedance at the seventh port 44 is 50Ω, the control circuit 14 tunes the tunable impedance of the tunable impedance load 54 so that the main RF amplifier 18 is presented a load impedance equal to 100Ω or double the characteristic amplifier impedance Znorm of the Doherty amplification circuit 12 at the fifth port 40. In this case, an impedance of the peaking RF amplifier 20 is very high and the peaking RF amplifier 20 appears like an open circuit with respect to the main RF amplifier 18 and the seventh port 44.

The load impedance is maintained approximately equal to double the characteristic amplifier impedance Znorm of the Doherty amplification circuit 12 at the fifth port 40 until the main RF amplifier 18 is approximately saturated and the peaking RF amplifier 20 is activated. While both the peaking RF amplifier 20 and the main RF amplifier 18 are activated, the control circuit 14 is configured to tune the tunable impedance of the tunable impedance load 54 smaller such that the load impedance presented by the second quadrature coupler 24 to the main RF amplifier 18 at the fifth port 40 is decreased as the RF power of the Doherty amplification circuit 12 is increased. In other words, the main RF amplifier 18 remains in saturation while the RF signal 16 is above the threshold level and the load impedance presented by the second quadrature coupler 24 to the main RF amplifier 18 at the fifth port 40 decreases as power to the peaking RF amplifier 20 is increased. The control circuit 14 tunes the tunable impedance load dynamically as the function of the RF power detected in the Doherty amplification circuit 12 such that the load impedance presented by the second quadrature coupler 24 to the main RF amplifier 18 has an impedance range from approximately double the characteristic amplifier impedance Znorm of the Doherty amplification circuit 12 to approximately the characteristic amplifier impedance Znorm of the Doherty amplification circuit 12. The load impedance presented at the fifth port 40 therefore varies from approximately 2*Znorm to Znorm as the RF power of the Doherty amplification circuit 12 is increased while the peaking RF amplifier 20 is activated. As such, the control circuit 14 is further configured to tune the tunable impedance of the tunable impedance load 54 dynamically as the function of the RF power of the Doherty amplification circuit 12 such that the load impedance presented by the second quadrature coupler 24 to the main RF amplifier 18 at the fifth port 40 is set approximately to the characteristic amplifier impedance Znorm when both the main RF amplifier 18 and the peaking RF amplifier 20 are approximately saturated.

To increase the power efficiency of the Doherty amplification circuit 12, the tunable impedance of the tunable impedance load 54 may have a variable real impedance (i.e., a variable resistance). Generally, the tunable impedance of the tunable impedance load 54 should be higher (i.e., by a factor of 5 or greater) than a real impedance of the load impedance presented at the seventh port 44 (i.e., the output port of the Doherty amplification circuit 12). Furthermore, to optimize the power efficiency in different RF communication bands, the tunable impedance of the tunable impedance load 54 may have different impedance levels at various frequencies for a given power level of the RF power and/or an imaginary impedance that compensates for non-ideal parasitic reactances of the output power load impedances of the peaking RF amplifier 20 and the main RF amplifier 18 across a wide frequency band. The control circuit 14 is configured to dynamically vary the real impedance and/or the imaginary impedance of the tunable impedance provided by the tunable impedance load 54 to provide the Doherty amplification operation described above.

With regard to the control circuit 14 shown in FIG. 1, the control circuit 14 is configured to generate an impedance control output 58 that sets the tunable impedance of the tunable impedance load 54. The impedance control output 58 may include one or more control signals that are operable to set the variable resistance and/or the variable reactance of the tunable impedance load 54. The function implemented by the control circuit 14 may thus map the RF power detected in the Doherty amplification circuit 12 to permutations of the impedance control output 58. These permutations of the impedance control output 58 set the tunable impedance of the tunable impedance load 54 to different impedance levels. More specifically, different permutations of the impedance control output 58 can be selected by the control circuit 14 to adjust the variable resistance and/or variable reactance in the manner explained above. As such, the real impedance and/or the imaginary impedance of the tunable impedance provided by the tunable impedance load 54 are set by the control circuit 14 using the impedance control output 58. The function implemented by the control circuit 14 may thus ultimately map the RF power detected in the Doherty amplification circuit 12 to desired impedance levels for the tunable impedance provided by the tunable impedance load 54.

The tunable impedance load 54 may include networks of passive and/or active circuit components that are responsive to the impedance control output 58 such that the tunable impedance of the tunable impedance load 54 is set in accordance with the particular permutation of the impedance control output 58 provided by the control circuit 14. The control circuit 14 may be configured to generate the impedance control output 58 such that the permutations of the impedance control output 58 are (at least partially) discrete permutations and/or (at least partially) continuous permutations. This may depend on a particular topology of the tunable impedance load 54. For example, a non-saturated transistor (not shown) or a non-saturated network of transistors may be used so that the variable resistance and/or the variable reactance can be varied in a continuous manner based on the impedance control output 58. In this case, the impedance control output 58 may be at least partially analog. However, the tunable impedance load 54 may also be provided by an impedance matching network in which switches selectively connect passive circuit components (i.e., resistors, capacitors, and/or inductors) so that the tunable impedance of the tunable impedance load 54 varies discretely. In this case, the tunable impedance load 54 may switch the switches on and off in response to the particular and discrete permutation of the impedance control output 58 from the control circuit 14.

Additionally, the function implemented by the control circuit 14 may further depend on other variables besides the RF power detected. In this embodiment, the control circuit 14 is further configured to receive a control input 60, which may include one or more control signals. The control input 60 is configured to indicate at least one operational frequency characteristic of the RF signal 16. For example, an operational frequency characteristic of the RF signal 16 may be a carrier frequency of the RF signal 16 where the control input 60 may include one or more control signals identifying the carrier frequency. The function implemented by the control circuit 14 may thus not only depend on the RF power detected but also on the carrier frequency of the RF signal 16. Alternatively or additionally, another operational frequency characteristic of the RF signal 16 may be a frequency band of the RF signal 16. In one embodiment, to indicate the frequency band of the RF signal 16, the control input 60 may indicate an RF communication specification (see above) used to format the RF signal 16, and thus may ultimately indicate the frequency band in which the RF signal 16 operates.

Furthermore, the control circuit 14 may be operable in a detect mode and in a non-detect mode. In the detect mode, the control circuit 14 is configured to detect the RF power in the Doherty amplification circuit 12, as described above. However, in the non-detect mode, the control input 60 may further indicate the RF power of the Doherty amplification circuit 12. For example, the RF power may be at a known a priori given power setting for transmission or reception of the RF signal 16. In this manner, the control circuit 14 may be configured to store a look-up table (in a non-transient computer-readable medium) and implement the look-up table, which indicates the permutation of the impedance control output 58 given the RF power and/or the operating frequency of the Doherty amplification circuit 12 that is indicated by the control input 60. As such, the control circuit 14 is also configured to tune the tunable impedance of the tunable impedance load 54 in accordance with the RF power and/or operating frequency of the Doherty amplification circuit 12 indicated by the control input 60.

Thus, in both the detect mode and the non-detect mode, the control circuit 14 may be configured to tune the tunable impedance of the tunable impedance load 54 dynamically based on the RF power of the Doherty amplification circuit 12 and the operational frequency characteristic(s) of the RF signal 16. This is advantageous, since the characteristic amplifier impedance Znorm presented at the fifth port 40 generally may vary based on the operational frequency characteristic(s) of the RF signal 16. Furthermore, the source impedance presented by the upstream RF circuitry (not shown) at the first port 26 and the load impedance presented by the downstream RF circuitry (not shown) at the seventh port 44 also vary based on the operational frequency characteristic(s) of the RF signal 16. Finally, the imaginary impedance of the tunable impedance provided by the tunable impedance load 54 varies depending on the operational frequency characteristic(s) of the RF signal 16. As such, since the function implemented by the control circuit 14 is both the function of the RF power of the Doherty amplification circuit 12 and of the operational frequency characteristic(s) of the RF signal 16, the control circuit 14 can provide the Doherty amplification operation in different RF communication bands. The RF amplification device 10 is thus configured for broadband operation. Note that other relevant quantities, such as temperature and biasing levels, may be indicated by the feedback input 56 and/or the control input 60. The function implemented by the control circuit 14 may further depend on these other relevant quantities so that the control circuit 14 can determine how the control circuit 14 tunes the tunable impedance load 54 based on a wider range of operational conditions.

As mentioned above, the Doherty amplification circuit 12 is configured to maintain the peaking RF amplifier 20 deactivated until the RF signal level of the RF signal 16 reaches the threshold level. Different embodiments of the Doherty amplification circuit 12 can be provided where the main RF amplifier 18 is simply a higher class of amplifier than the peaking RF amplifier 20. In this embodiment, the main RF amplifier 18 is a Class A amplifier while the peaking RF amplifier is a Class C amplifier. The Doherty amplification circuit 12 shown in FIG. 1 is configured to activate the peaking RF amplifier 20 when the main RF amplifier 18 is below saturation. However, in alternative embodiments, the peaking RF amplifier 20 may be activated before the main RF amplifier 18 is saturated or at least prior to the main RF amplifier 18 becoming fully saturated. For example, the peaking RF amplifier 20 may be configured to be activated before the main RF amplifier 18 reaches saturation if the main RF amplifier 18 is a Class A amplifier and the peaking RF amplifier 20 is a Class AB amplifier. In some applications, this helps linearize the Doherty amplification circuit 12 and increases power efficiency.

Since different classes of amplifier may be provided for both the main RF amplifier 18 and the peaking RF amplifier 20 in the Doherty amplification circuit 12, the peaking RF amplifier 20 may or may not be off when the peaking RF amplifier 20 is deactivated. This may depend on the class of the peaking RF amplifier 20. More specifically, the peaking RF amplifier 20 being activated and deactivated refers to whether the peaking RF amplifier 20 is providing amplification or not providing amplification. Depending on the class of amplifiers being used for the main RF amplifier 18 and the peaking RF amplifier 20, the peaking RF amplifier 20 may not be off when the peaking RF amplifier 20 is deactivated. For example, if the peaking RF amplifier 20 is the Class C amplifier described above, the peaking RF amplifier 20 may not be truly off during operation, but may be deactivated because the peaking RF amplifier 20 is not providing amplification. In contrast, if the peaking RF amplifier 20 is a Class B amplifier, the peaking RF amplifier 20 may be turned off in order to deactivate the peaking RF amplifier 20. Thus, how the peaking RF amplifier 20 is activated and deactivated may depend on a particular implementation of the Doherty amplification circuit 12.

With regard to the Doherty amplification circuit 12 shown in FIG. 1, the first quadrature coupler 22 is configured such that the first port 26 is phase-aligned with the fourth port 32 and such that the second port 28 is phase-aligned with the third port 30. In addition, the first quadrature coupler 22 is configured such that the first port 26 has a quadrature phase shift with respect to the third port 30, and such that the second port 28 (i.e., the isolation port of the first quadrature coupler 22) has a quadrature phase shift with respect to the fourth port 32. While the peaking RF amplifier 20 is deactivated, the input impedance of the peaking RF amplifier 20 essentially appears like an open circuit. As such, in this case, the RF signal 16 is not split, but is passed to the third port 30 and an input terminal 36 of the main RF amplifier 18. Accordingly, the first quadrature coupler 22 is configured to provide the RF signal 16 such that there is a quadrature phase difference between the RF signal 16 at the first port 26 and the third port 30 while the peaking RF amplifier 20 is deactivated. The main RF amplifier 18 is then configured to amplify the RF signal 16 and output the RF signal 16 from the output terminal 48. In this manner, the RF signal 16 is provided to the second quadrature coupler 24 at the fifth port 40.

The second quadrature coupler 24 is configured to receive the RF signal 16 at the fifth port 40 while the peaking RF amplifier 20 is deactivated.

The second quadrature coupler 24 is configured such that the fifth port 40 is phase-aligned with the seventh port 44 (i.e., the output port of the Doherty amplification circuit 12) and such that the sixth port 42 is phase-aligned with the eighth port 46. In addition, the second quadrature coupler 24 is configured such that the fifth port 40 has a quadrature phase shift with respect to the eighth port 46 (i.e., the isolation port of the second quadrature coupler 24) and the sixth port 42 has a quadrature phase shift with respect to the seventh port 44. While the peaking RF amplifier 20 is deactivated, the output impedance of the peaking RF amplifier 20 essentially appears like an open circuit. However, since the fifth port 40 has the quadrature phase shift with respect to the eighth port 46 (i.e., the isolation port of the second quadrature coupler 24) and since the first quadrature coupler 22 provided the quadrature phase shift to the RF signal 16 at the third port 30, the tunable impedance appears very high (ideally, infinite) at the eighth port 46. The RF signal 16 is again not split. Instead, the second quadrature coupler 24 is configured to pass the RF signal 16 to the seventh port 44 while the peaking RF amplifier 20 is deactivated. As such, the Doherty amplification circuit 12 is configured to output the RF signal 16 from the seventh port 44 to downstream RF circuitry (not shown) once the main RF amplifier 18 has amplified the RF signal 16. Consequently, the total amplification gain of the Doherty amplification circuit 12 is set entirely by the amplification gain of the main RF amplifier 18 while the peaking RF amplifier 20 is deactivated.

The peaking RF amplifier 20 is activated when the signal level of the RF signal 16 is reaches or is above the threshold voltage at the first port 26 (i.e., the input port of the Doherty amplification circuit 12). While the peaking RF amplifier 20 is activated, the input impedance of the peaking RF amplifier 20 decreases inversely with respect to the RF signal level of the RF signal 16. As such, in this case, the RF signal 16 is split, but is passed to the third port 30 and the input terminal 36 of the main RF amplifier 18. Accordingly, the first quadrature coupler 22 is configured to provide the RF signal

16 such that there is a quadrature phase difference between the RF signal 16 at the first port 26 and the third port 30 while the peaking RF amplifier 20 is deactivated. The main RF amplifier 18 is then configured to amplify the RF signal 16 and output the RF signal 16 from the output terminal 48. In this manner, the RF signal 16 is provided to the second quadrature coupler 24 at the fifth port 40.

The second quadrature coupler 24 is configured to receive the RF signal 16 at the fifth port 40 while the peaking RF amplifier 20 is deactivated. The second quadrature coupler 24 is configured such that the fifth port 40 is phase-aligned with the seventh port 44 (i.e., the output port of the Doherty amplification circuit 12) and such that the sixth port 42 is phase-aligned with the eighth port 46. In addition, the second quadrature coupler 24 is configured such that the fifth port 40 has a quadrature phase shift with respect to the eighth port 46 (i.e., the isolation port of the second quadrature coupler 24) and the sixth port 42 has a quadrature phase shift with respect to the seventh port 44.

While the peaking RF amplifier 20 is deactivated, the output impedance of the peaking RF amplifier 20 essentially appears like an open circuit. However, since the fifth port 40 has the quadrature phase shift with respect to the eighth port 46 (i.e., the isolation port of the second quadrature coupler 24) and since the first quadrature coupler 22 provided the quadrature phase shift to the RF signal 16 at the third port 30, the tunable impedance appears very high (ideally, infinite) at the eighth port 46. The RF signal 16 is again not split. Instead, the second quadrature coupler 24 is configured to pass the RF signal 16 to the seventh port 44 while the peaking RF amplifier 20 is deactivated. As such, the Doherty amplification circuit 12 is configured to output the RF signal 16 from the seventh port 44 to downstream RF circuitry (not shown) once the main RF amplifier 18 has amplified the RF signal 16. Consequently, the total amplification gain of the Doherty amplification circuit 12 from the first port 26 (i.e., the input port of the Doherty amplification circuit 12) to the seventh port 44 (i.e., the output port of the Doherty amplification circuit 12) is set entirely by the amplification gain of the main RF amplifier while the peaking RF amplifier 20 is deactivated.

The Doherty amplification circuit 12 is configured such that the peaking RF amplifier 20 is activated when the RF signal level of the RF signal 16 is at or above the threshold level. While the main RF amplifier 18 is activated and the peaking RF amplifier 20 is activated, the first quadrature coupler 22 is configured to split the RF signal 16 into a first RF split signal 62 and a second RF split signal 64. As explained above, the first quadrature coupler 22 is configured to receive the RF signal 16 at the first port 26. The first quadrature coupler 22 provides the quadrature phase shift from the first port 26 to the fourth port 32, and thus, the first RF split signal 62 is received by the main RF amplifier 18 at the input terminal 36 with a quadrature phase shift while both the main RF amplifier 18 and the peaking RF amplifier 20 are activated. The first port 26 of the first quadrature coupler 22 is also phase-aligned with the fourth port 32. As such, the second RF split signal 64 is phase-aligned with the RF signal 16 at the first port 26. Consequently, the first RF split signal 62 at the third port 30 and the second RF split signal 64 at the fourth port 32 have a quadrature phase difference with respect to one another.

In this case, the main RF amplifier 18 is (or is nearly) saturated, and thus the input impedance of the main RF amplifier 18 increases as the RF signal level of the RF signal 16 increases. On the other hand, the input impedance of the peaking RF amplifier 20 decreases as the RF signal level of the RF signal 16 increases above the threshold level. As such, a proportion of an amount of power of the RF signal 16 in the second RF split signal 64 relative to an amount of power of the RF signal 16 in the first RF split signal 62 increases as the RF signal level of the RF signal 16 at the first port 26 increases relative to the threshold level. The inverse of this relationship is also true, and therefore the proportion decreases as the RF signal level of the RF signal 16 decreases relative to the threshold level at the first port 26 while both the main RF amplifier 18 and the peaking RF amplifier 20 are activated.

Additionally, while both the main RF amplifier 18 and the peaking RF amplifier 20 are activated, the main RF amplifier 18 is configured to amplify the first RF split signal 62 in accordance with the amplification gain of the main RF amplifier 18 and output the first RF split signal 62 from the output terminal 48. The second quadrature coupler 24 is configured to receive the first RF split signal 62 from the main RF amplifier 18 at the fifth port 40. The peaking RF amplifier 20 is configured to receive the second RF split signal 64 at an input terminal 38. While both the main RF amplifier 18 and the peaking RF amplifier 20 are activated, the peaking RF amplifier 20 is configured to amplify the second RF split signal 64 in accordance with the amplification gain of the peaking RF amplifier 20 and output the second RF split signal 64 from the output terminal 50. The second quadrature coupler 24 is configured to receive the second RF split signal 64 from the peaking RF amplifier 20 at the sixth port 42.

The second quadrature coupler 24 is configured to combine the first RF split signal 62 and the second RF split signal 64 back into the RF signal 16 after the first RF split signal 62 and the second RF split signal 64 are amplified by the main RF amplifier 18 and the peaking RF amplifier 20, respectively. More specifically, the first quadrature coupler 22 is configured such that the first RF split signal 62 passes to the seventh port 44 just like the RF signal 16 when the peaking RF amplifier 20 is deactivated.

Similarly since the sixth port 42 has a quadrature phase shift with respect to the seventh port 44 (i.e., the isolation port of the second quadrature coupler 24) and since the first quadrature coupler 22 provides no phase shift to the second RF split signal 64 at the fourth port 32 with respect to the first port 26, the second RF split signal 64 thus passes to the seventh port 44. Furthermore, the first RF split signal 62 and the second RF split signal 64 become phase-aligned at the seventh port 44 because the second quadrature coupler 24 is configured to provide the quadrature phase shift to the second RF split signal 64 between the sixth port 42 and the seventh port 44. As such, the second quadrature coupler 24 combines the first RF split signal 62 and the second RF split signal 64 into the RF signal 16 at the seventh port 44 once the Doherty amplification circuit 12 has amplified the RF signal 16. Consequently, the total amplification gain of the Doherty amplification circuit 12 from the first port 26 (i.e., the input port of the Doherty amplification circuit 12) to the seventh port 44 (i.e., the output port of the Doherty amplification circuit 12) is set in accordance with the amplification gain of the main RF amplifier 18, the amplification gain of the peaking RF amplifier 20, and the proportion of the RF signal 16 provided in the first RF split signal 62 at the third port 30 relative to the second RF split signal 64 at the fourth port 32 while both the main RF amplifier 18 and the peaking RF amplifier 20 are activated.

It should be noted that while the tunable impedance load 54 is coupled to the eighth port 46 in the embodiment shown in FIG. 1, this may or may not be the case in other embodiments. For example, in a first alternative embodiment, the tunable impedance load 54 is coupled to the second port 28 of the first quadrature coupler 22, while the impedance load 34 is coupled to the eighth port 46 of the second quadrature coupler 24. In this case, the control circuit 14 would thus control the tunable impedance of the tunable impedance load 54 in the same manner described above, except that with regard to tuning the tunable impedance of the tunable impedance load 54, the load impedance should be switched with the output impedance of the upstream RF circuitry at the first port 26 (i.e., the other exogenous connection port). In a second alternative embodiment, the tunable impedance load 54 is still coupled to the eighth port 46, but another tunable impedance load that is similar to the tunable impedance load 54 is coupled to the second port 28. In this case, the control circuit 14 would simultaneously tune the tunable impedance load 54, as described above for the RF amplification device 10 shown in FIG. 1, and tune a tunable impedance of the other tunable impedance load at the second port 28 in the same manner as the tunable impedance load 54 in the first alternative embodiment.

Referring again to the RF amplification device 10 shown in FIG. 1, the RF amplification device 10 is formed as an integrated circuit (IC) on a semiconductor substrate 66. The semiconductor substrate 66 has a substrate body 68 formed from a wafer and/or doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers may be formed on a top, within, and/or on a bottom of the substrate body 68 to provide terminals, traces, contact pads, coils, connections, passive impedance elements, active semiconductor components, and/or the like. Also, any type of suitable semiconductor technology may be used to provide the topology of the semiconductor substrate 66. For example, the semiconductor technology of the semiconductor substrate 66 may be Complementary Metal-On-Oxide Semiconductor (CMOS) technology, BiComplementary Metal-On-Oxide Semiconductor (BiCMOS) technology, Silicon-On-Insulator (SOI) technology, and/or the like. In this embodiment, the semiconductor technology is SOI, and thus the semiconductor material of the substrate body 68 is Si.

FIG. 2 illustrates an exemplary RF amplification device 10(1), which is one embodiment of the RF amplification device 10 shown in FIG. 1. The RF amplification device 10(1) includes a Doherty amplification circuit 12(1) and a control circuit 14(1). The Doherty amplification circuit 12(1) is one embodiment of the Doherty amplification circuit 12 shown in FIG. 1. Thus, the Doherty amplification circuit 12(1) includes a main RF amplifier 18(1), a peaking RF amplifier 20(1), a first quadrature coupler 22(1), and a second quadrature coupler 24(1).

The main RF amplifier 18(1) is one embodiment of the main RF amplifier 18 described above with respect to FIG. 1, and thus operates in the same manner as the main RF amplifier 18 described above. The main RF amplifier 18(1) thus includes the input terminal 36 and the output terminal 48. In this embodiment, the main RF amplifier 18(1) is a Class A amplifier built using one or more field effect transistors (FETs). The main RF amplifier 18(1) is configured to receive a supply voltage VS in order to power amplification by the main RF amplifier 18(1). As such, a supply current ID1 is generated from the supply voltage VS within the main RF amplifier 18(1) while the main RF amplifier 18(1) is activated.

The peaking RF amplifier 20(1) is one embodiment of the peaking RF amplifier 20 described above with respect to FIG. 1, and thus operates in the same manner as the peaking RF amplifier 20 described above. The peaking RF amplifier 20(1) thus includes the input terminal 38 and the output terminal 50. In this embodiment, the peaking RF amplifier 20(1) is a Class C amplifier built using one or more FETs. The peaking RF amplifier 20(1) is also configured to receive the supply voltage VS in order to power amplification by the peaking RF amplifier 20(1). As such, a supply current ID2 is generated by the supply voltage VS within the peaking RF amplifier 20(1), where a supply current level of the supply current ID2 depends on harmonic characteristics of the Doherty amplification circuit 12(1), both while the peaking RF amplifier 20(1) is activated and while the peaking RF amplifier 20(1) is deactivated.

The first quadrature coupler 22(1) is one embodiment of the first quadrature coupler 22 described above with respect to FIG. 1, and thus operates in the same manner as the first quadrature coupler 22 described above. The first quadrature coupler 22(1) thus includes the first port 26, the second port 28, the third port 30, and the fourth port 32. Also, the RF signal 16 is received at the first port 26, the impedance load 34 is coupled to the second port 28, the input terminal 36 is coupled to the third port 30, and the input terminal 38 is coupled to the fourth port 32. In this embodiment, the first quadrature coupler 22(1) is a hybrid coupler.

The second quadrature coupler 24(1) is one embodiment of the second quadrature coupler 24 described above with respect to FIG. 1, and thus operates in the same manner as the second quadrature coupler 24 described above. The second quadrature coupler 24(1) thus includes the fifth port 40, the sixth port 42, the seventh port 44, and the eighth port 46. Also, the output terminal 48 is coupled to the fifth port 40, the output terminal 50 is coupled to the sixth port 42, the RF signal 16 is output from the seventh port 44, and the tunable impedance load 54 is coupled to the eighth port 46. In this embodiment, the second quadrature coupler 24(1) is also a hybrid coupler.

The control circuit 14(1) is one embodiment of the control circuit 14 described above with respect to FIG. 1, and thus operates in the same manner as the control circuit 14 described above. The control circuit 14(1) is configured to generate the impedance control output 58 in the same manner described above to tune the tunable impedance of the tunable impedance load 54 as the function of the RF power detected in the Doherty amplification circuit 12(1). However, in this embodiment, the control circuit 14(1) is coupled to the seventh port 44 (i.e., the output port of the Doherty amplification circuit 12(1)) to detect RF power in the Doherty amplification circuit 12(1). More specifically, the control circuit 14(1) is coupled to the seventh port 44 in order to receive a feedback signal 56(1).

The feedback signal 56(1) is one embodiment of the feedback input 56 described above with respect to FIG. 1, and the feedback signal 56(1) has a feedback signal level that indicates the RF power of the Doherty amplification circuit 12(1). More specifically, the feedback signal level (e.g., feedback voltage level, feedback current level, etc.) of the feedback signal 56(1) is set in accordance with the RF signal level (e.g., RF voltage level, RF current level, etc.) of the RF signal 16 after the Doherty amplification circuit 12(1) has amplified the RF signal 16. The RF signal level (e.g., RF voltage level, RF current level, etc.) of the RF signal 16 is related to the RF power by the Doherty amplification circuit 12(1), since the RF signal level of the RF signal 16 at the seventh port 44 depends on an amount of power provided by the Doherty amplification circuit 12(1). Since the feedback signal level of the feedback signal 56(1) is set in accordance with the RF signal level of the RF signal 16 at the seventh port 44, the feedback signal level of the feedback signal 56(1) indicates the RF power of the Doherty amplification circuit 12(1). By detecting the feedback signal level of the feedback signal 56(1), the control circuit 14(1) is configured to detect the RF power of the Doherty amplification circuit 12(1). The control circuit 14(1) is also configured to receive the control input 60 described above with respect to FIG. 1. The function implemented by the control circuit 14(1) thus maps the feedback signal level of the feedback signal 56(1) and the operational frequency characteristic(s) indicated by the control input 60 to permutations of the impedance control output 58. The control circuit 14(1) is thus configured to dynamically tune the tunable impedance of the tunable impedance load 54 with the impedance control output 58 as described above with respect to the control circuit 14 shown in FIG. 1.

Figure 3:
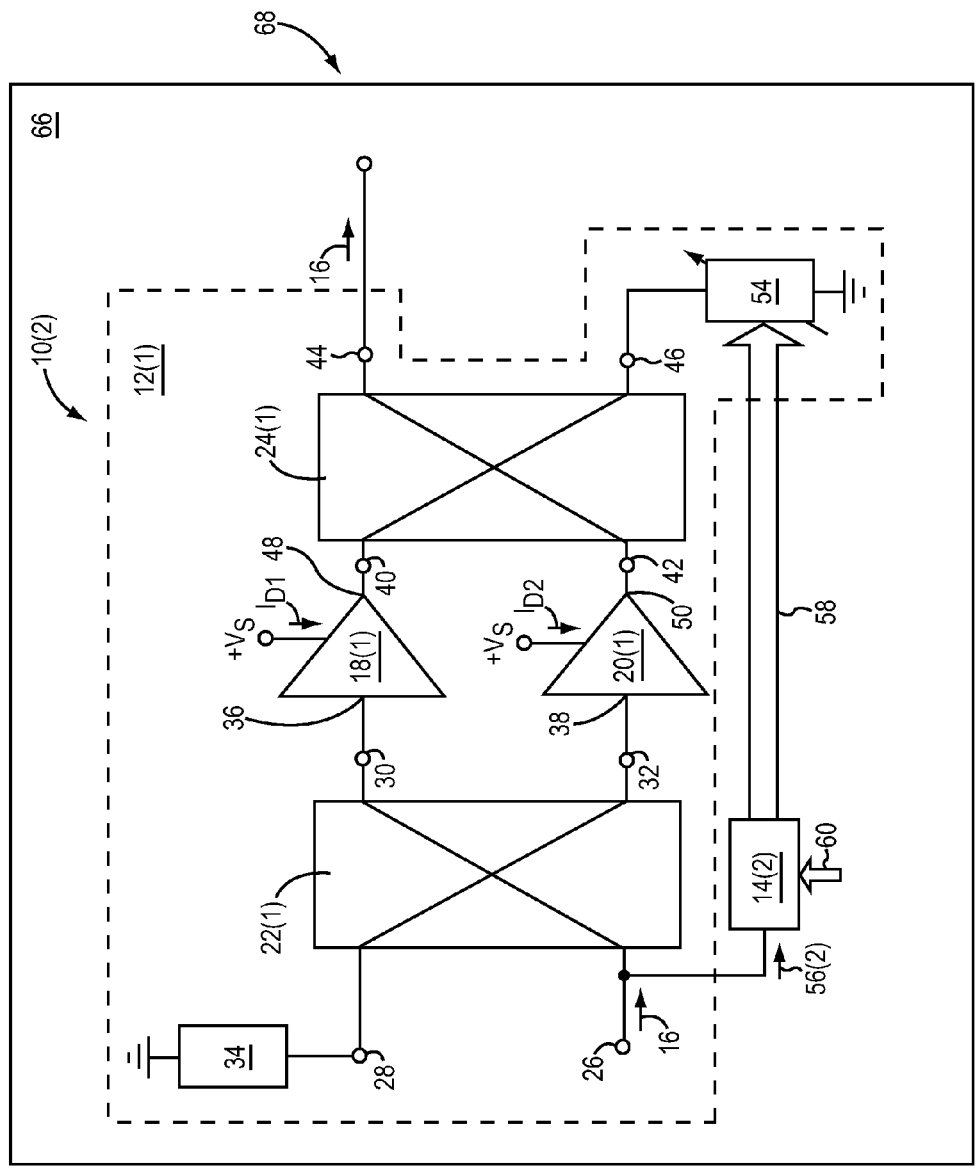
FIG. 3 illustrates another embodiment of the RF amplification device shown in FIG. 1, wherein the control circuit is configured to detect RF power in the Doherty amplification circuit at an input port provided by the first quadrature coupler.

FIG. 3 illustrates another exemplary RF amplification device 10(2), which is another embodiment of the RF amplification device 10 shown in FIG. 1. The RF amplification device 10(2) includes the Doherty amplification circuit 12(1) described above with respect to FIG. 2. However, the RF amplification device 10(2) includes another embodiment of a control circuit 14(2). The control circuit 14(2) is another embodiment of the control circuit 14 described above with respect to FIG. 1, and thus operates in the same manner as the control circuit 14 described above. The control circuit 14(2) is configured to generate the impedance control output 58 in the same manner described above to tune the tunable impedance of the tunable impedance load 54 as the function of the RF power detected in the Doherty amplification circuit 12(1). However, in this embodiment, the control circuit 14(2) is coupled to the first port 26 (i.e., the input port of the Doherty amplification circuit 12(1)) to detect the RF power in the Doherty amplification circuit 12(1). More specifically, the control circuit 14(2) is coupled to the first port 26 in order to receive a feedback signal 56(2).

The feedback signal 56(2) is another embodiment of the feedback input 56 described above with respect to FIG. 1, and the feedback signal 56(2) has a feedback signal level that indicates the RF power of the Doherty amplification circuit 12(1). More specifically, the feedback signal level (e.g., feedback voltage level, feedback current level, etc.) of the feedback signal 56(2) is set in accordance with the RF signal level (e.g., RF voltage level, RF current level, etc.) of the RF signal 16 before the Doherty amplification circuit 12(1) has amplified the RF signal 16. The RF signal level (e.g., RF voltage level, RF current level, etc.) of the RF signal 16 is related to the RF power by the Doherty amplification circuit 12(1), since the RF signal level of the RF signal 16 at the first port 26 indicates an amount of power that the Doherty amplification circuit 12(1) will use to amplify the RF signal 16. Since the feedback signal level of the feedback signal 56(2) is set in accordance with the RF signal level of the RF signal 16 at the first port 26, the feedback signal level of the feedback signal 56(2) indicates the RF power of the Doherty amplification circuit 12(1). By detecting the feedback signal level of the feedback signal 56(2), the control circuit 14(2) is configured to detect the RF power of the Doherty amplification circuit 12(1). The control circuit 14(2) is also configured to receive the control input 60 described above with respect to FIG. 1. The function implemented by the control circuit 14(2) thus maps the feedback signal level of the feedback signal 56(2) and the operational frequency characteristic(s) indicated by the control input 60 to permutations of the impedance control output 58. The control circuit 14(2) is thus configured to dynamically tune the tunable impedance of the tunable impedance load 54 with the impedance control output 58 as described above with respect to the control circuit 14 shown in FIG. 1.

Figure 4:
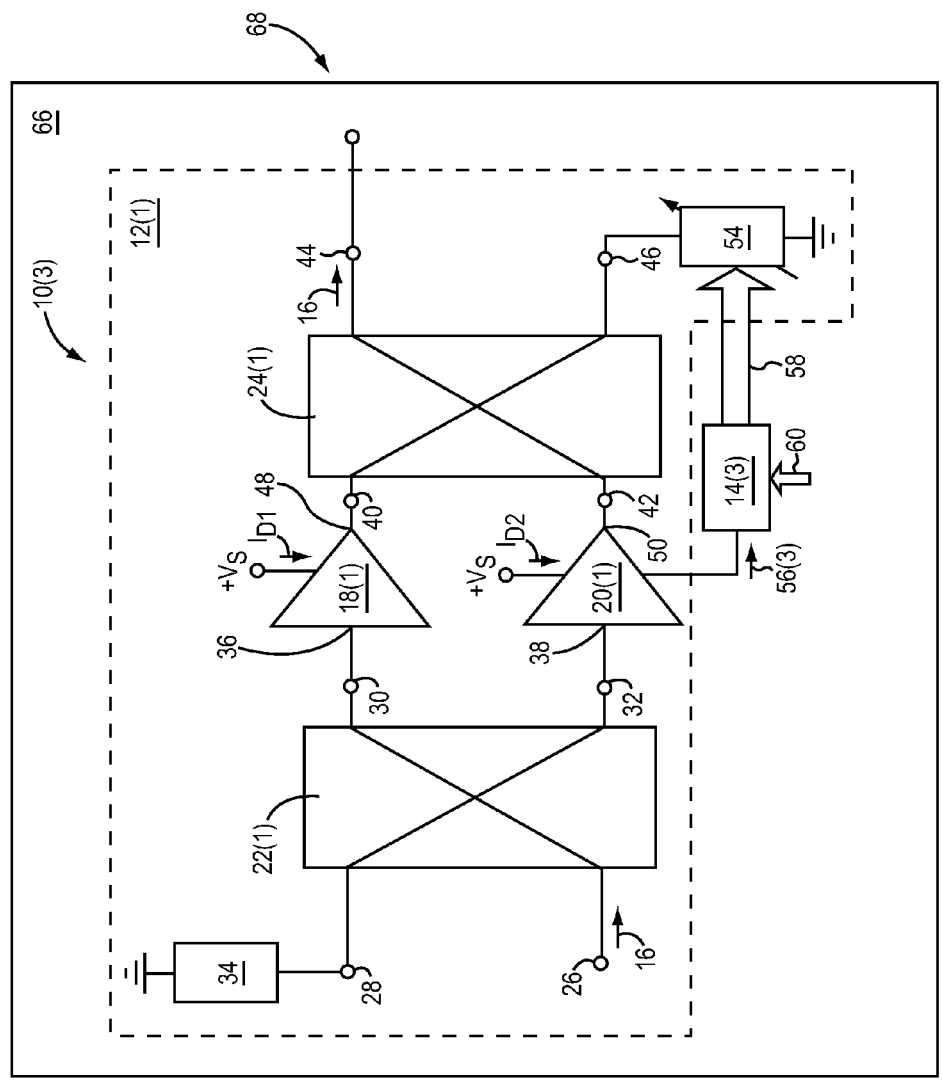
FIG. 4 illustrates yet another embodiment of the RF amplification device shown in FIG. 1, wherein the control circuit is configured to detect RF power in the Doherty amplification circuit from a supply current provided to the peaking RF amplifier.

FIG. 4 illustrates another exemplary RF amplification device 10(3), which is another embodiment of the RF amplification device 10 shown in FIG. 1. The RF amplification device 10(3) also includes the Doherty amplification circuit 12(1) described above with respect to FIG. 2. However, the RF amplification device 10(3) includes another embodiment of a control circuit 14(3). The control circuit 14(3) is another embodiment of the control circuit 14 described above with respect to FIG. 1, and thus operates in the same manner as the control circuit 14 described above. The control circuit 14(3) is configured to generate the impedance control output 58 in the same manner described above to tune the tunable impedance of the tunable impedance load 54 as the function of the RF power detected in the Doherty amplification circuit 12(1). However, in this embodiment, the control circuit 14(3) is coupled to an internal node (not explicitly shown) of the peaking RF amplifier 20(1). More specifically, the control circuit 14(3) is coupled to the internal node in order to receive a feedback signal 56(3).

The feedback signal 56(3) is another embodiment of the feedback input 56 described above with respect to FIG. 1, and the feedback signal 56(3) has a feedback signal level that indicates the RF power of the Doherty amplification circuit 12(1). More specifically, the feedback signal level (e.g., feedback voltage level, feedback current level, etc.) of the feedback signal 56(3) is set in accordance with the supply current ID2 provided to the peaking RF amplifier 20(1). Since the peaking RF amplifier 20(1) is a Class C amplifier, a supply current level of the supply current ID2 is related to the RF power of the Doherty amplification circuit 12(1). The control circuit 14(3) is coupled to the peaking RF amplifier 20(1) such that a feedback signal level of the feedback signal 56(3) is set in accordance with the supply current level of the supply current ID2. The feedback signal level of the feedback signal 56(3) therefore indicates the RF power of the Doherty amplification circuit 12(1). By detecting the feedback signal level of the feedback signal 56(3), the control circuit 14(3) is configured to detect the RF power of the Doherty amplification circuit 12(1). The control circuit 14(3) is also configured to receive the control input 60 described above with respect to FIG. 1. The function implemented by the control circuit 14(3) thus maps the feedback signal level of the feedback signal 56(3) and the operational frequency characteristic(s) indicated by the control input 60 to permutations of the impedance control output 58. The control circuit 14(3) is thus configured to dynamically tune the tunable impedance of the tunable impedance load 54 with the impedance control output 58 as described above with respect to the control circuit 14 shown in FIG. 1.

FIG. 5 illustrates an exemplary tunable impedance load 54(1). The tunable impedance load 54(1) is one embodiment of the tunable impedance load 54 described above with respect to FIG. 1. The tunable impedance load 54(1) shown in FIG. 5 includes a plurality of selectable impedance branches (referred to generically as elements 72 and specifically as elements 72(1)-72(6)). The selectable impedance branches 72 are each coupled in parallel with respect to one another. An input terminal 74 of the tunable impedance load 54(1) may be coupled to the eighth port 46 (shown in FIGS. 1-4).

The selectable impedance branches include resistors (referred to generically as elements 76 and specifically as elements 76(1)-76(6)) and switches (referred to generically as elements 78 and specifically as elements 78(1)-78(6)). More specifically, the selectable impedance branch 72(1) includes a resistor 76(1) coupled in series with a switch 78(1). The selectable impedance branch 72(2) includes a resistor 76(2) coupled in series with a switch 78(2). Additionally, the selectable impedance branch 72(3) includes a resistor 76(3) coupled in series with a switch 78(3). Furthermore, the selectable impedance branch 72(4) includes a resistor 76(4) coupled in series with a switch 78(4). Also, the selectable impedance branch 72(5) includes a resistor 76(5) coupled in series with a switch 78(5). Finally, the selectable impedance branch 72(6) includes a resistor 76(6) coupled in series with a switch 78(6).

For each of the selectable impedance branches 72, the selectable impedance branch 72 is configured to be selected when the switch 78 in the selectable impedance branch 72 is closed, and to be deselected when the switch 78 in the selectable impedance branch 72 is open. Each of the resistors 76 may have a different resistance. The resistance of the resistor 76 of the selectable impedance branch 72 is presented at the input terminal 74 (and thus at the eighth port 46 shown in FIGS. 1-4) when the switch 78 in the selectable impedance branch 72 is closed. Otherwise, when the switch 78 in the selectable impedance branch 72 is open, the selectable impedance branch 72 appears as an open circuit. Each of the switches 78 shown in FIG. 5 may be any type of suitable switch. For example, the switches 78 may be provided as FETs and/or as microelectromechanical switches (MEMSs).

The switches 78 are opened and closed in response to an impedance control output 58(1), which is one embodiment of the impedance control output 58 described above with respect to FIGS. 1-4. In this embodiment, the impedance control output 58(1) includes a plurality of switch control signals (referred to generically as elements 80 and specifically as elements 80(1)-80(6)). Each of the switch control signals 80 is received by a corresponding one of the switches 78. For each of the switch control signals 80, the switch control signal 80 received by the switch 78. The switch 78 is activated when the switch control signal 80 is in a switch activation state and the switch 78 is deactivated when the switch control signal 80 is in a switch deactivation state. A switch control signal 80(1) provided in the impedance control output 58(1) is received by the switch 78(1). A switch control signal 80(2) provided in the impedance control output 58(1) is received by the switch 78(2). A switch control signal 80(3) provided in the impedance control output 58(1) is received by the switch 78(3). A switch control signal 80(4) provided in the impedance control output 58(1) is received by the switch 78(4). A switch control signal 80(5) provided in the impedance control output 58(1) is received by the switch 78(5). A switch control signal 80(6) provided in the impedance control output 58(1) is received by the switch 78(6). Permutations of the impedance control output 58(1) thus refer to particular combinations of the switch control signals 80 that are in the switch activation state and in the switch deactivation state.

Since the switches 78 are used to vary the tunable impedance presented at the input terminal 74, the tunable impedance load 54(1) discretely varies the tunable impedance. Furthermore, in this embodiment, the tunable impedance is purely resistive because each of the selectable impedance branches 72 only includes the resistors 76 and no reactive components.

Referring now to FIG. 2, FIG. 5, and FIG. 6, FIG. 6 is a graph illustrating power curves 84, 86, 88, and 90 that describe power added efficiency (PAE) as a function of output power in the RF amplification device 10(1) shown in FIG. 2. Furthermore, to obtain the power curves 84, 86, 88, and 90, the tunable impedance load 54 (shown in FIG. 2) is provided as the tunable impedance load 54(1) shown in FIG. 5, and the impedance control output 58 (shown in FIG. 2) is provided as the impedance control output 58(1) (shown in FIG. 5).

The power curve 84 is provided by the RF amplification device 10(1). More specifically, the power curve 84 is provided by the RF amplification device 10(1) when a carrier frequency of the RF signal 16 (shown in FIG. 2) is approximately 680 Megahertz (MHz) and the tunable impedance of the tunable impedance load 54(1) is set to approximately equal to Znorm×10 by the impedance control output 58(1) shown in FIG. 5.

The power curve 86 is provided by the RF amplification device 10(1). More specifically, the power curve 86 is provided by the RF amplification device 10(1) when a carrier frequency of the RF signal 16 (shown in FIG. 2) is approximately 850 MHz and the tunable impedance of the tunable impedance load 54(1) is set to approximately equal Znorm×10 by the impedance control output 58(1) shown in FIG. 5. Again, Znorm is the normalized (conventional characteristic impedance, Zo) termination impedance of the second quadrature coupler 24(1) (shown in FIG. 2) at the eighth port 46 (shown in FIG. 2).

The power curve 88 is provided by the RF amplification device 10(1). More specifically, the power curve 88 is provided by the RF amplification device 10(1) when a carrier frequency of the RF signal 16 (shown in FIG. 2) is approximately 1020 MHz. Furthermore, the tunable impedance of the tunable impedance load 54(1) is set to approximately equal to Znorm×10 by the impedance control output 58(1) shown in FIG. 5.

The power curve 90 is provided by the RF amplification device 10(1). More specifically, the power curve 90 is provided by the RF amplification device 10(1) when a carrier frequency of the RF signal 16 (shown in FIG. 2) is approximately 850 MHz and the tunable impedance of the tunable impedance load 54(1) is set to approximately equal to Znorm by the impedance control output 58(1) shown in FIG. 5.

The tunable impedance of the tunable impedance load 54(1) is entirely resistive. The PAE is fifty-five percent (55%) when output power is at two (2) watts, and a PAE improvement of eight percent (8%) is provided at backed-off levels compared to conventional Doherty amplification circuits. As mentioned above, the power curve 90 is provided when the carrier frequency of the RF signal is at 850 MHz and when the tunable impedance of the tunable impedance load 54(1) is set to the characteristic impedance Zo, which is equal to Znorm. As such, the power curve 90 shows the Doherty amplification circuit 12(1) operating in a non-Doherty fashion to provide amplification. Therefore, a configuration indicated by power curve 90 is often employed in amplification device designs that are load-insensitive given particular cellular applications. The performance of the RF amplification device 10(1) decreases frequency variation when the tunable impedance of the tunable impedance load 54(1) is set to Znorm×10. As such, the RF amplification device 10(1) demonstrates better overall bandwidth-efficiency.

FIG. 7 illustrates another exemplary tunable impedance load 54(2). The tunable impedance load 54(2) is another embodiment of the tunable impedance load 54 described above with respect to FIG. 1. Like the tunable impedance load 54(1) shown in FIG. 5, the tunable impedance load 54(2) includes a plurality of selectable impedance branches (referred to generically as elements 92 and specifically as elements 92(1)-92(6)). The selectable impedance branches 92 are each coupled in parallel with respect to one another. An input terminal 94 of the tunable impedance load 54(2) may be coupled to the eighth port 46 (shown in FIGS. 1-4).

The selectable impedance branches include resistors (referred to generically as elements 96 and specifically as elements 96(1)-96(6)), switches (referred to generically as elements 98 and specifically as elements 98(1)-98(6)), and inductors (referred to generically as elements 100 and specifically as elements 100(1)-100(6)). More specifically, the selectable impedance branch 92(1) includes a resistor 96(1), a switch 98(1), and an inductor 100(1) coupled in series. The selectable impedance branch 92(2) includes a resistor 96(2), a switch 98(2), and an inductor 100(2) coupled in series. Additionally, the selectable impedance branch 92(3) includes a resistor 96(3), a switch 98(3), and an inductor 100(3) coupled in series. Furthermore, the selectable impedance branch 92(4) includes a resistor 96(4), a switch 98(4), and an inductor 100(4) coupled in series. Also, the selectable impedance branch 92(5) includes a resistor 96(5), a switch 98(5), and an inductor 100(5) coupled in series. Finally, the selectable impedance branch 92(6) includes a resistor 96(6), a switch 98(6), and an inductor 100(6) coupled in series.

For each of the selectable impedance branches 92, the selectable impedance branch 92 is configured to be selected when the switch 98 in the selectable impedance branch 92 is closed, and to be deselected when the switch 98 in the selectable impedance branch 92 is open. Each of the resistors 96 may have a different resistance and each of the inductors 100 may have a different inductance. The resistance of the resistor 96 and the inductance of the inductor 100 of the selectable impedance branch 92 is presented at the input terminal 94 (and thus at the eighth port 46 shown in FIGS. 1-4) when the switch 98 in the selectable impedance branch 92 is closed. Otherwise, when the switch 98 in the selectable impedance branch 92 is open, the selectable impedance branch 92 appears as an open circuit. Each of the switches 98 shown in FIG. 5 may be any type of suitable switch. For example, the switches 98 may be provided by as FETs and/or MEMs.

The switches 98 are opened and closed by an impedance control output 58(2). The impedance control output 58(2) is one embodiment of the impedance control output 58 described above with regard to FIGS. 1-4. In this embodiment, the impedance control output 58(2) includes a plurality of switch control signals (referred to generically as elements 102 and specifically as elements 102(1)-102(6)). Each of the switch control signals 102 is received by a corresponding one of the switches 98. For each of the switch control signals 102, the switch control signal 102 is received by the corresponding switch 98. The switch 78 is activated when the switch control signal 102 is in a switch activation state and the switch 78 is deactivated when the switch control signal 102 is in a switch deactivation state. A switch control signal 102(1) provided in the impedance control output 58(2) is received by the switch 98(1). A switch control signal 102(2) provided in the impedance control output 58(2) is received by the switch 98(2). A switch control signal 102(3) provided in the impedance control output 58(2) is received by the switch 98(3). A switch control signal 102(4) provided in the impedance control output 58(2) is received by the switch 98(4). A switch control signal 102(5) provided in the impedance control output 58(2) is received by the switch 98(5). A switch control signal 102(6) provided in the impedance control output 58(2) is received by the switch 98(6). Thus, in this embodiment, permutations of the impedance control output 58(2) refer to particular combinations of the switch control signals 102 that are in the switch activation state and in the switch deactivation state.

Since the switches 98 are used to vary the tunable impedance presented at the input terminal 94, the tunable impedance load 54(2) discretely varies the tunable impedance. Furthermore, in this embodiment, the tunable impedance is both resistive and reactive, since each of the selectable impedance branches 92 includes one of the resistors 96 and one of the inductors 100.

Referring now to FIG. 2, FIG. 7, and FIG. 8, FIG. 8 is a graph illustrating power curves 104, 106, 108, and 110 that describe PAE as a function of output power from the RF amplification device 10(1) shown in FIG. 2. Furthermore, to obtain the power curves 104, 106, 108, and 110, the tunable impedance load 54 (shown in FIG. 2) is provided as the tunable impedance load 54(2) shown in FIG. 7 and the impedance control output 58 (shown in FIG. 2) is provided as the impedance control output 58(2) (shown in FIG. 7).

The power curve 104 is provided by the RF amplification device 10(1). More specifically, the power curve 104 is provided by the RF amplification device 10(1) when a carrier frequency of the RF signal 16 (shown in FIG. 2) is approximately 680 MHz and the tunable impedance of the tunable impedance load 54(2) is set to approximately equal Znorm×10 by the impedance control output 58(2) shown in FIG. 7. The power curve 106 is also provided by the RF amplification device 10(1). More specifically, the power curve 106 is provided by the RF amplification device 10(1) when a carrier frequency of the RF signal 16 (shown in FIG. 2) is approximately 850 MHz and the tunable impedance of the tunable impedance load 54(2) is set to approximately equal Znorm×10 by the impedance control output 58(2) shown in FIG. 7. Again, Znorm is the normalized (conventional characteristic impedance, Zo) termination impedance of the second quadrature coupler 24(1) (shown in FIG. 2) at the eighth port 46 (shown in FIG. 2).

Additionally, the power curve 108 is provided by the RF amplification device 10(1). More specifically, the power curve 108 is provided by the RF amplification device 10(1) when a carrier frequency of the RF signal 16 (shown in FIG. 2) is approximately 1020 MHz. Furthermore, the tunable impedance of the tunable impedance load 54(2) is set to approximately equal Znorm×10 by the impedance control output 58(2) shown in FIG. 7.

Finally, the power curve 110 is provided by the RF amplification device 10(1). More specifically, the power curve 110 is provided by the RF amplification device 10(1) when a carrier frequency of the RF signal 16 (shown in FIG. 2) is approximately 850 MHz and the tunable impedance of the tunable impedance load 54(2) is set to approximately equal Znorm by the impedance control output 58(2) shown in FIG. 7.

In this embodiment, the tunable impedance of the tunable impedance load 54(2) is both resistive and reactive (e.g., inductive). The power curves 104-110 thus show a frequency sweep of the RF amplification device 10(1) described above with respect to FIG. 2 when the tunable impedance load 54(2) described above with respect to FIG. 7 is used by the RF amplification device 10(1). The PAE is 58% when the output power of the RF amplification device 10(1) is at 2 watts. This indicates an 11% improvement in PAE at the backed-off power level. Also, since the tunable impedance of the tunable impedance load 54(2) provides a variable reactance (i.e., the inductances of the inductors 100), the tunable impedance load 54(2) in FIG. 7 is configured to improve the PAE than the tunable impedance load 54(1) shown in FIG. 5.

FIG. 9 is a graph illustrating a power curve 112 and a power curve 114 that describe PAE as a function of output power. The power curve 112 and the power curve 114 are both produced by the RF amplification device 10(1) shown in FIG. 2 when the carrier frequency of the RF signal 16 is at 680 MHz and the tunable impedance is approximately equal to Znorm×10. However, the tunable impedance load 54(1) shown in FIG. 5 is provided as the tunable impedance load 54 shown in FIG. 2 to produce the power curve 112. Furthermore, the tunable impedance load 54(2) shown in FIG. 7 is provided as the tunable impedance load 54 to produce the power curve 114. FIG. 9 thus illustrates that the tunable impedance load 54(2) shown in FIG. 7 has slightly better PAE at 680 MHz than the tunable impedance load 54(1) shown in FIG. 5, which is purely resistive.

FIG. 10 is a graph illustrating a power curve 116 and a power curve 118 that describe PAE as a function of output power. The power curve 116 and the power curve 118 are both produced by the RF amplification device 10(1) shown in FIG. 2 when the carrier frequency of the RF signal 16 is at 1020 MHz and the tunable impedance is approximately equal to Znorm×10. However, the tunable impedance load 54(1) shown in FIG. 5 is provided as the tunable impedance load 54 shown in FIG. 2 to produce the power curve 116. Furthermore, the tunable impedance load 54(2) shown in FIG. 7 is provided as the tunable impedance load 54 to produce the power curve 118. Because the tunable impedance load 54(2) has an imaginary impedance that is inductive, the tunable impedance of the tunable impedance load 54(2) increases at higher frequencies. As a result, the tunable impedance load 54(2) improves the upper-band power-efficiency performance of the Doherty amplification circuit 12(1) and therefore can extend its bandwidth capability. Since the tunable impedance of the tunable impedance load 54(2) is complex, the control circuit 14(1) can tune the tunable impedance of the tunable impedance load 54(2) so that the Doherty amplification circuit 12(1) operates optimally in multi-band applications.

FIG. 11 is a graph illustrating a power curve 120, a power curve 122, and a power curve 124 that describe PAE as a function of output power. The power curve 120, the power curve 122, and the power curve 124 are each produced by the RF amplification device 10(1) shown in FIG. 2 when the carrier frequency of the RF signal 16 is at 1020 MHz. However, the tunable impedance load 54(1) shown in FIG. 5 is provided as the tunable impedance load 54 shown in FIG. 2 to produce the power curve 120 and the power curve 122. In contrast, the tunable impedance load 54(2) shown in FIG. 7 is provided as the tunable impedance load 54 shown in FIG. 2 to produce the power curve 124.

With regard to the power curve 120, the tunable impedance of the tunable impedance load 54(1) has been set to approximately equal Znorm×10. The tunable impedance load 54(1) has been set to approximately equal Znorm×40 to produce the power curve 124. As such, the tunable impedance of the tunable impedance load 54(1) can be optimized by adjusting the tunable impedance of the tunable impedance load 54(1) to approximately equal Znorm×40 at 1020 MHz. For example, if the required frequency of operation is shifted to 1020 MHz, the control circuit 14(1) shown in FIG. 2 dynamically tunes the tunable impedance of the tunable impedance load 54(1) so that the tunable impedance approximately equals Znorm×40.

However, as shown in FIG. 11, the tunable impedance load 54(2) can be used to achieve even greater power efficiency at 1020 MHz. In this example, the tunable impedance of the tunable impedance load 54(2) has been set to Znorm×10. Thus, the tenability of the reactive impedance of the tunable impedance provided by the tunable impedance load 54(2) allows for increased power efficiency. However, in some applications, the inductors 100 shown in FIG. 7 may be large in size with respect to a size of the resistors 96. Thus, the tunable impedance load 54(1) may be implemented in an application in order to conserve space. In different embodiments, different combination of inductors (e.g., the inductors 100 in FIG. 7) and resistors (e.g., the resistors 96 in FIG. 7) may be employed to provide the tunable impedance load 54 shown in FIG. 2. It should be noted at this point that the present disclosure is not limited to any particular arrangement for the tunable impedance load 54. For example, any combination of passive or active IC impedance components may be used to provide the tunable impedance. All such variations are considered to be within the scope of this disclosure.

FIG. 12 is a graph illustrating a power curve 126, a power curve 128, and a power curve 130. In this embodiment, the power curve 126, the power curve 128, and the power curve 130 are all produced by the RF amplification device 10(1) shown in FIG. 2, where the tunable impedance load 54 is provided as the tunable impedance load 54(1) shown in FIG. 5. FIG. 12 demonstrates the advantage provided to the Doherty amplification circuit 12(1) as a result of the dynamic tunability provided by the control circuit 14(1). Both the power curve 126 and the power curve 128 are produced with the tunable impedance load 54(1) is set to Znorm×10. Both the power curve 128 and the power curve 130 are produced with the carrier frequency of the RF signal 16 set to 1020 MHz. The power curve 126 is produced with the carrier frequency of the RF signal 16 set to 850 MHz. The power curve 130 is produced with the tunable impedance load 54(1) is set to Znorm×30.

A comparison of the power curve 126 with the power curve 128 demonstrates that PAE is degraded when the tunable impedance of the tunable impedance load 54(1) is set to Znorm×10 if the carrier frequency of the RF signal 16 is adjusted from 850 MHz to 1020 MHz. The power curve 130 demonstrates that increased power efficiency can be achieved by tuning the tunable impedance of the tunable impedance load 54(1) to Znorm×30. The control circuit 14(1) is configured to tune the tunable impedance of the tunable impedance load 54(1) to Znorm×30 when the carrier frequency is adjusted from 850 MHz to 1020 MHz. In this manner, the Doherty amplification circuit 12(1) can be tuned so as to optimize power performance.

As mentioned above, any combination of passive or active IC impedance components may be used to provide the tunable impedance. FIGS. 13 and 14 illustrate additional embodiments of the tunable impedance load 54 shown in FIGS. 1-4.

In this regard, FIG. 13 illustrates another embodiment of a tunable impedance load 54(3). The tunable impedance load 54(3) is another embodiment of the tunable impedance load 54 described above with respect to FIG. 1. The tunable impedance load 54(3) is similar to the tunable impedance load 54(2) shown in FIG. 7. Like the tunable impedance load 54(2) shown in FIG. 7, the tunable impedance load 54(3) includes a plurality of selectable impedance branches (referred to generically as elements 132 and specifically as elements 132(1)-132(6)). The selectable impedance branches 132 are each coupled in parallel with respect to one another. An input terminal 134 of the tunable impedance load 54(3) may be coupled to the eighth port 46 (shown in FIGS. 1-4).

The selectable impedance branches include resistors (referred to generically as elements 136 and specifically as elements 136(1)-136(6)), switches (referred to generically as elements 138 and specifically as elements 138(1)-138(6)), and inductors (referred to generically as elements 140 and specifically as elements 140(1)-140(6)). More specifically, the selectable impedance branch 132(1) includes a resistor 136(1), a switch 138(1), and an inductor 140(1) coupled in series. The selectable impedance branch 132(2) includes a resistor 136(2), a switch 138(2), and an inductor 140(2) coupled in series. Additionally, the selectable impedance branch 132(3) includes a resistor 136(3), a switch 138(3), and an inductor 140(3) coupled in series. Furthermore, the selectable impedance branch 132(4) includes a resistor 136(4), a switch 138(4), and an inductor 140(4) coupled in series. Also, the selectable impedance branch 132(5) includes a resistor 136(5), a switch 138(5), and an inductor 140(5) coupled in series. Finally, the selectable impedance branch 132(6) includes a resistor 136(6), a switch 138(6), and an inductor 140(6) coupled in series.

For each of the selectable impedance branches 132, the selectable impedance branch 132 is configured to be selected when the switch 138 in the selectable impedance branch 132 is closed, and to be deselected when the switch 138 in the selectable impedance branch 132 is open. Each of the resistors 136 may have a different resistance and each of the inductors 140 may have a different inductance. The resistance of the resistor 136 and the inductance of the inductor 140 of the selectable impedance branch 132 is presented at the input terminal 134 (and thus at the eighth port 46 shown in FIGS. 1-4) when the switch 138 in the selectable impedance branch 132 is closed. Otherwise, when the switch 138 in the selectable impedance branch 132 is open, the selectable impedance branch 132 appears as an open circuit. Each of the switches 138 shown in FIG. 5 may be any type of suitable switch. For example, the switches 138 may be provided by as FETs and/or MEMs.

The switches 138 are opened and closed by an impedance control output 58(3). The impedance control output 58(3) is one embodiment of the impedance control output 58 described above with regard to FIGS. 1-4. In this embodiment, the impedance control output 58(3) includes a plurality of switch control signals (referred to generically as elements 142 and specifically as elements 142(1)-142(6)). Each of the switch control signals 142 is received by a corresponding one of the switches 138. For each of the switch control signals 142, the corresponding switch control signal 142 received by the switch 138 is activated when the switch control signal 142 is in a switch activation state, and is deactivated when the switch control signal 142 is in a switch deactivation state. A switch control signal 142(1) provided in the impedance control output 58(3) is received by the switch 138(1). A switch control signal 142(2) provided in the impedance control output 58(3) is received by the switch 138(2). A switch control signal 142(3) provided in the impedance control output 58(3) is received by the switch 138(3). A switch control signal 142(4) provided in the impedance control output 58(3) is received by the switch 138(4). A switch control signal 142(5) provided in the impedance control output 58(3) is received by the switch 138(5). A switch control signal 142(6) provided in the impedance control output 58(3) is received by the switch 138(6). Thus, in this embodiment, permutations of the impedance control output 58(3) refer to particular combinations of the switch control signals 142 that are in the switch activation state and in the switch deactivation state.

Since the switches 138 are used to vary the tunable impedance presented at the input terminal 134, the tunable impedance load 54(2) discretely varies the tunable impedance. Furthermore, in this embodiment, the tunable impedance is both resistive and reactive, since each of the selectable impedance branches 132 includes one of the resistors 136 and one of the inductors 140. However, unlike the tunable impedance load 54(2) shown in FIG. 7, the inductors 140(4), 140(5), and 140(6) each have a much higher inductance than an inductance of each of the inductors 140(1), 140(2), and 140(3). Accordingly, the inductors 140(4), 140(5), and 140(6) may physically be significantly larger than the inductors 140(1), 140(2), and 140(3). This thus allows for the tunable impedance load 54(3) to be used in multiband applications when certain RF communication specifications have stringent quality (Q) factor requirements.

With regard to FIG. 14, FIG. 14 illustrates another embodiment of a tunable impedance load 54(4). The tunable impedance load 54(4) is another embodiment of the tunable impedance load 54 described above with respect to FIG. 1. The tunable impedance load 54(4) includes a plurality of selectable impedance branches (referred to generically as elements 144 and specifically as elements 144(1)-144(6)). The selectable impedance branches 144 are each coupled in parallel with respect to one another. An input terminal 146 of the tunable impedance load 54(4) may be coupled to the eighth port 46 (shown in FIGS. 1-4).

In this embodiment, the selectable impedance branches 144(1), 144(3), and 144(5) (referred to collectively as elements 144CAP) include capacitors (referred to generically as elements 148 and specifically as elements 148(1)-148(3)). In contrast, the selectable impedance branches 144(2), 144(4), and 144(6) (referred to collectively as elements 144RL) include resistors (referred to generically as elements 150 and specifically as elements 150(1)-150(3)) and inductors (referred to generically as elements 152 and specifically as elements 152(1)-152(3)). The selectable impedance branches 144 also include switches (referred to generically as elements 154 and specifically as elements 154(1)-154(6)).

More specifically, the selectable impedance branch 144(1) includes a capacitor 148(1) and a switch 154(1) coupled in series. The selectable impedance branch 144(2) includes a resistor 150(1), an inductor 152(1), and a switch 154(2) coupled in series. Additionally, the selectable impedance branch 144(3) includes a capacitor 148(2) and a switch 154(3) coupled in series. Furthermore, the selectable impedance branch 144(4) includes a resistor 150(2), an inductor 152(2), and a switch 154(4) coupled in series. Also, the selectable impedance branch 144(5) includes a capacitor 148(3) and a switch 154(5) coupled in series. Finally, the selectable impedance branch 144(6) includes a resistor 150(3), an inductor 152(3), and a switch 154(6) coupled in series.

For each of the selectable impedance branches 144, the selectable impedance branch 144 is configured to be selected when the switch 154 in the selectable impedance branch 144 is closed, and to be deselected when the switch 154 in the selectable impedance branch 144 is open. Each of the capacitors 148 may have a different capacitance, each of the resistors 150 may have a different resistance, and each of the inductors 152 may have a different inductance. The capacitance of the capacitor 148 of each of the selectable impedance branches 144CAP is presented at the input terminal 146 when the switch 154 in the selectable impedance branches 144CAP is closed. The resistance of the resistor 150 and the inductance of the inductor 152 of each of the selectable impedance branches 144RL is presented at the input terminal 146 (and thus the eighth port 46 shown in FIGS. 1-4) when the switch 154 in the selectable impedance branches 144RL is closed. Otherwise, when the switch 154 in the selectable impedance branch 144 is open, the selectable impedance branch 144 appears as an open circuit.

In this embodiment, different resonant impedance tanks may be presented at the input terminal 146 by selecting different combinations of the capacitors 148, the resistors 150, and the inductors 152. More specifically, different resonant impedance tanks may be presented at the input terminal 146 by selecting one or more of the selectable impedance branches 144CAP and by selecting one or more of the selectable impedance branches 144RL. In this manner, the tunable impedance of the tunable impedance load 54(4) can be provided with a high Q factor, which is advantageous in high frequency applications.

The switches 154 are opened and closed by an impedance control output 58(4). The impedance control output 58(4) is one embodiment of the impedance control output 58 described above with regard to FIGS. 1-4. In this embodiment, the impedance control output 58(4) includes a plurality of switch control signals (referred to generically as elements 156 and specifically as elements 156(1)-156(6)). Each of the switch control signals 156 is received by a corresponding one of the switches 154. For each of the switch control signals 156, the corresponding switch control signal 156 received by the switch 154 is activated when the switch control signal 156 is in a switch activation state and is deactivated when the switch control signal 156 is in a switch deactivation state. A switch control signal 156(1) provided in the impedance control output 58(4) is received by the switch 154(1). A switch control signal 156(2) provided in the impedance control output 58(4) is received by the switch 154(2). A switch control signal 156(3) provided in the impedance control output 58(4) is received by the switch 154(3). A switch control signal 156(4) provided in the impedance control output 58(4) is received by the switch 154(4). A switch control signal 156(5) provided in the impedance control output 58(4) is received by the switch 154(5). A switch control signal 156(6) provided in the impedance control output 58(4) is received by the switch 154(6). Thus, in this embodiment, permutations of the impedance control output 58(4) thus refer to particular combinations of the switch control signals 156 that are in the switch activation state and in the switch deactivation state.

Since the switches 156 are used to vary the tunable impedance presented at the input terminal 146, the tunable impedance load 54(4) discretely varies the tunable impedance. Furthermore, in this embodiment, the tunable impedance is both resistive and reactive since each of the selectable impedance branches 144RL include one of the resistors 150 and one of the inductors 152, and since each of the selectable impedance branches 144CAP includes one of the capacitors 148. In this manner, the tunable impedance of the tunable impedance load 54(4) is a complex impedance and thus includes a real impedance and an imaginary impedance.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) amplification device comprising:
    a Doherty amplification circuit that functions as a Doherty amplifier and configured to amplify an RF signal, wherein the Doherty amplification circuit includes a main RF amplifier, a peaking RF amplifier, a quadrature coupler and a tunable impedance load configured to provide a tunable impedance, wherein the main RF amplifier is coupled to the quadrature coupler, the peaking RF amplifier is coupled to the quadrature coupler, the quadrature coupler has an isolation port and the tunable impedance load is coupled to the isolation port of the quadrature coupler, and wherein the peaking RF amplifier is configured to be deactivated while the RF signal is below a threshold level and is configured to be activated while the RF signal is above the threshold level and the main RF amplifier is configured to be activated while the RF signal is below the threshold level and above the threshold level; and
    a control circuit configured to dynamically detect RF power of the Doherty amplification circuit and dynamically tune the tunable impedance of the tunable impedance load as a function of the RF power of the Doherty amplification circuit such that a load impedance presented by the quadrature coupler to the main RF amplifier is approximately equal to double a characteristic amplifier impedance of the Doherty amplification circuit while the peaking RF amplifier is deactivated and the main RF amplifier is activated.

2. The RF amplification device of claim 1 wherein the Doherty amplification circuit further comprises a second quadrature coupler and wherein:
    the main RF amplifier is coupled between the quadrature coupler and the second quadrature coupler; and
    the peaking RF amplifier is coupled between the quadrature coupler and the second quadrature coupler.

3. The RF amplification device of claim 1 wherein:
    the main RF amplifier is a Class A amplifier; and
    the peaking RF amplifier is a Class C amplifier.

4. The RF amplification device of claim 1 wherein the control circuit is further configured to tune the tunable impedance of the tunable impedance load dynamically as the function of the RF power of the Doherty amplification circuit such that the load impedance presented by the quadrature coupler to the main RF amplifier is approximately equal to a characteristic amplifier impedance of the Doherty amplification circuit when the main RF amplifier and the peaking RF amplifier are both approximately saturated.

5. A radio frequency (RF) amplification device comprising:
    a Doherty amplification circuit that functions as a Doherty amplifier and configured to amplify an RF signal, wherein the Doherty amplification circuit includes a main RF amplifier, a peaking RF amplifier, a quadrature coupler and a tunable impedance load configured to provide a tunable impedance, wherein the main RF amplifier is coupled to the quadrature coupler, the peaking RF amplifier is coupled to the quadrature coupler, the quadrature coupler has an isolation port and the tunable impedance load is coupled to the isolation port of the quadrature coupler, and wherein the peaking RF amplifier is configured to be deactivated while an RF signal is below a threshold level and is configured to be activated while the RF signal is above the threshold level and the main RF amplifier is configured to be activated while the RF signal is below the threshold level and above the threshold level; and a control circuit configured to dynamically detect RF power of the Doherty amplification circuit and tune the tunable impedance of the tunable impedance load dynamically as a function of the RF power of the Doherty amplification circuit such that a load impedance presented by the quadrature coupler to the main RF amplifier is decreased as the RF power of the Doherty amplification circuit is increased.

6. The RF amplification device of claim 5 wherein the control circuit is further configured to tune the tunable impedance of the tunable impedance load dynamically as the function of the RF power of the Doherty amplification circuit such that the load impedance presented by the quadrature coupler to the main RF amplifier has an impedance range from approximately a characteristic amplifier impedance of the Doherty amplification circuit to approximately double the characteristic amplifier impedance of the Doherty amplification circuit.

7. The RF amplification device of claim 6 wherein the control circuit is further configured to tune the tunable impedance of the tunable impedance load dynamically as the function of the RF power of the Doherty amplification circuit such that the load impedance presented by the quadrature coupler to the main RF amplifier is set approximately to double the characteristic amplifier impedance while the peaking RF amplifier is deactivated and the load impedance presented by the quadrature coupler to the main RF amplifier is set approximately to the characteristic amplifier impedance when both the main RF amplifier and the peaking RF amplifier are approximately saturated.

8. A radio frequency, (RF) amplification device comprising:

a Doherty amplification circuit that functions as a Doherty amplifier and configured to amplify an RF signal, wherein the Doherty amplification circuit includes a main RF amplifier, a peaking RF amplifier, a quadrature coupler, a second quadrature coupler and a tunable impedance load configured to provide a tunable impedance, wherein the main RF amplifier is coupled between the quadrature coupler and the second quadrature coupler, the peaking RF amplifier is coupled between the quadrature coupler and the second quadrature coupler, the quadrature coupler has an isolation port, the tunable impedance load is coupled to the isolation port of the quadrature coupler and the second quadrature coupler has an input port configured to receive the RF signal for the Doherty amplification circuit, wherein the peaking RF amplifier is configured to be deactivated while an RF signal is below a threshold level and is configured to be activated while the RF signal is above the threshold level, the main RF amplifier is configured to be activated while the RF signal is below the threshold level and above the threshold level, and the second quadrature coupler is operably associated with the quadrature coupler so as to pass the RF signal to the main RF amplifier while the peaking RF amplifier is deactivated and split the RF signal into a first RF split signal and a second RF split signal while the peaking RF amplifier is activated, and wherein the second quadrature coupler is configured to pass the first RF split signal to the main RF amplifier and pass the second RF split signal to the peaking RF amplifier while the peaking RF amplifier is activated; and a control circuit configured to dynamically detect RF power of the Doherty amplification circuit and dynamically tune the tunable impedance of the tunable impedance load as a function of the RF power.

9. The RF amplification device of claim 8 wherein the quadrature coupler further includes an output port configured to output the RF signal after amplification by the Doherty amplification circuit and wherein the quadrature coupler is configured to:

pass the RF signal from the main RF amplifier to the output port while the peaking RF amplifier is deactivated; and combine the first RF split signal and the second RF split signal into the RF signal such that the RF signal is output from the output port after amplification by the Doherty amplification circuit while the peaking RF amplifier is activated.

10. The RF amplification device of claim 9 further comprising a second impedance load wherein the second quadrature coupler includes a second isolation port coupled to the second impedance load.

11. A radio frequency, (RF) amplification device comprising:

a Doherty amplification circuit that functions as a Doherty amplifier and configured to amplify an RF signal, wherein the Doherty amplification circuit includes a main RF amplifier, a peaking RF amplifier, a quadrature coupler and a tunable impedance load configured to provide a tunable impedance, and wherein the quadrature coupler has an isolation port and the tunable impedance load is coupled to the isolation port of the quadrature coupler; and a control circuit configured to dynamically detect RF power of the Doherty amplification circuit and dynamically tune the tunable impedance of the tunable impedance load as a function of the RF power, wherein the control circuit is further configured to receive a control input that indicates at least one operational frequency characteristic of the RF signal, and wherein the control circuit is configured to tune the tunable impedance of the tunable impedance load dynamically as the function is further of the at least one operational frequency characteristic indicated by the control input.

12. A radio frequency, (RF) amplification device comprising:

a Doherty amplification circuit that functions as a Doherty amplifier and configured to amplify an RF signal, wherein the Doherty amplification circuit includes a main RF amplifier, a peaking RF amplifier, a quadrature coupler and a tunable impedance load configured to provide a tunable impedance, and wherein the quadrature coupler an output port configured to output the RF signal after amplification by the Doherty amplification circuit and an isolation port coupled to the tunable impedance load ; and a control circuit configured to dynamically detect RF power of the Doherty amplification circuit and dynamically tune the tunable impedance of the tunable impedance load as a function of the RF power, wherein the control circuit is coupled to the output port and is configured to detect the RF power in the Doherty amplification circuit by being configured to receive a feedback signal having a feedback signal level set in accordance with an RF signal level of the RF signal when the RF signal is output from the output port of the quadrature coupler.

13. A radio frequency, (RF) amplification device comprising:
a Doherty amplification circuit that functions as a Doherty amplifier and configured to amplify an RF signal, wherein the Doherty amplification circuit includes a main RF amplifier, a peaking RF amplifier, a quadrature coupler and a tunable impedance load configured to provide a tunable impedance, wherein the main RF amplifier is coupled to the quadrature coupler and, the peaking RF amplifier is coupled to the quadrature coupler, the quadrature coupler has an isolation port and the tunable impedance load is coupled to the isolation port of the quadrature coupler, and wherein the peaking RF amplifier is configured to receive a supply voltage such that a supply current is generated by the supply voltage; and
a control circuit configured to dynamically detect RF power of the Doherty amplification circuit and dynamically tune the tunable impedance of the tunable impedance load as a function of the RF power, wherein the control circuit is coupled to the peaking RF amplifier and is configured to detect the RF power in the Doherty amplification circuit by being configured to receive a feedback signal having a feedback signal level set in accordance with a supply current level of the supply current.

14. The RF amplification device of claim 13 wherein the Doherty amplification circuit further comprises a second quadrature coupler and wherein:
the main RF amplifier is coupled between the quadrature coupler and the second quadrature coupler; and
the peaking RF amplifier is coupled between the quadrature coupler and the second quadrature coupler.

15. A radio frequency ORFS amplification device comprising:
a Doherty amplification circuit that functions as a Doherty amplifier and configured to amplify an RF signal, wherein the Doherty amplification circuit includes a main RF amplifier, a peaking RF amplifier, a quadrature coupler, a second quadrature coupler and a tunable impedance load configured to provide a tunable impedance, and wherein the quadrature coupler has an isolation port coupled to the tunable impedance load and the second quadrature coupler has an input port configured to receive the RF signal for the Doherty amplification circuit; and
a control circuit configured to dynamically detect RF power of the Doherty amplification circuit and dynamically tune the tunable impedance of the tunable impedance load as a function of the RF power, wherein the control circuit is coupled to the input port and is configured to detect the RF power in the Doherty amplification circuit by being configured to receive a feedback signal having a feedback signal level set in accordance with an RF signal level of the RF signal at the input port of the second quadrature coupler.

16. A radio frequency (RF) amplification device comprising:
a Doherty amplification circuit that functions as a Doherty amplifier and configured to amplify an RF signal, wherein the Doherty amplification circuit includes a main RF amplifier, a peaking RF amplifier, a quadrature coupler and a tunable impedance load configured to provide a tunable impedance, and wherein the quadrature coupler has an isolation port and the tunable impedance load is coupled to the isolation port of the quadrature coupler; and
a control circuit configured to receive a control input that indicates the RF power of the Doherty amplification circuit, store a look-up table, and tune the tunable impedance of the tunable impedance load dynamically as the function of the RF power of the Doherty amplification circuit indicated by the control input by being configured to implement the look-up table.

17. A radio frequency, (RF) amplification device comprising:
a Doherty amplification circuit that functions as a Doherty amplifier and configured to amplify an RF signal, wherein the Doherty amplification circuit includes a main RF amplifier, a peaking RF amplifier, a quadrature coupler and a tunable impedance load configured to provide a tunable impedance, wherein the quadrature coupler has an isolation port and the tunable impedance load is coupled to the isolation port of the quadrature coupler, and wherein the tunable impedance load comprises a plurality of selectable impedance branches including a plurality of switches; and
a control circuit configured to tune the tunable impedance of the tunable impedance load dynamically as a function of the RF power of the Doherty amplification circuit by being configured to generate an impedance control output as the function of the RF power of the Doherty amplification circuit, wherein the tunable impedance load is configured to receive the impedance control output and operate the plurality of switches in accordance with the impedance control output.

18. The RF amplification device of claim 17 wherein the plurality of selectable impedance branches further includes a plurality of resistors such that each of the plurality of selectable impedance branches comprises a corresponding one of the plurality of switches coupled in series with a corresponding one of the plurality of resistors.

19. The RF amplification device of claim 18 wherein each of the plurality of selectable impedance branches consists of the corresponding one of the plurality of switches coupled in series with the corresponding one of the plurality of resistors.

20. The RF amplification device of claim 18 wherein the plurality of selectable impedance branches further includes a plurality of inductors such that each of the plurality of selectable impedance branches comprises a corresponding one of the plurality of inductors coupled in series with the corresponding one of the plurality of switches and the corresponding one of the plurality of resistors.

21. The RF amplification device of claim 17 wherein:
a first subset of the plurality of selectable impedance branches further includes a plurality of resistors and a plurality of inductors, wherein each one of the first subset of the plurality of selectable impedance branches comprises a corresponding one of the plurality of switches, a corresponding one of the plurality of inductors, and a corresponding one of the plurality of resistors such that the corresponding one of the plurality of switches, the corresponding one of the plurality of inductors, and the corresponding one of the plurality of resistors are coupled in series; and
a second subset of the plurality of selectable impedance branches further includes a plurality of capacitors, wherein each one of the second subset of the plurality of selectable impedance branches comprises a corresponding one of the plurality of switches and a corresponding one of the plurality of capacitors, such that the corresponding one of the plurality of switches and the corresponding one of the plurality of capacitors are coupled in series.

* * * * *